(12) United States Patent
Danilov et al.

(10) Patent No.: US 11,349,500 B2
(45) Date of Patent: May 31, 2022

(54) DATA RECOVERY IN A GEOGRAPHICALLY DIVERSE STORAGE SYSTEM EMPLOYING ERASURE CODING TECHNOLOGY AND DATA CONVOLUTION TECHNOLOGY

(71) Applicant: EMC IP Holding Company LLC, Hopkinton, MA (US)

(72) Inventors: Mikhail Danilov, Saint Petersburg (RU); Yohannes Altaye, Dumfries, VA (US)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 240 days.

(21) Appl. No.: 16/743,427

(22) Filed: Jan. 15, 2020

(65) Prior Publication Data

US 2021/0218420 A1 Jul. 15, 2021

(51) Int. Cl.
| | |
|---|---|
| *H03M 13/00* | (2006.01) |
| *H03M 13/29* | (2006.01) |
| *H03M 13/23* | (2006.01) |
| *G06F 9/30* | (2018.01) |
| *G06F 11/14* | (2006.01) |

(52) U.S. Cl.
CPC ...... *H03M 13/293* (2013.01); *G06F 9/30029* (2013.01); *G06F 11/1451* (2013.01); *G06F 11/1461* (2013.01); *G06F 11/1489* (2013.01); *H03M 13/235* (2013.01)

(58) Field of Classification Search
CPC .............. H03M 13/293; H03M 13/235; G06F 9/30029; G06F 11/1451; G06F 11/1461; G06F 11/1489; G06F 3/067; G06F 11/10

USPC ......................................... 714/746, 752, 776
See application file for complete search history.

(56) References Cited

U.S. PATENT DOCUMENTS

| | | | | |
|---|---|---|---|---|
| 8,683,205 | B2* | 3/2014 | Resch ................. | G06F 11/2094 713/176 |
| 9,864,527 | B1* | 1/2018 | Srivastav ................ | G06F 3/065 |
| 2005/0216813 | A1* | 9/2005 | Cutts .................... | G06F 11/1076 714/752 |
| 2012/0268142 | A1* | 10/2012 | Kremin ................. | G06F 3/0446 324/658 |
| 2013/0021294 | A1* | 1/2013 | Maharyta .............. | G06F 3/0446 345/174 |
| 2014/0089564 | A1* | 3/2014 | Liu ...................... | G06F 12/0246 711/103 |

(Continued)

*Primary Examiner* — Albert Decady
*Assistant Examiner* — Osman M Alshack
(74) *Attorney, Agent, or Firm* — Amin, Turocy & Watson, LLP

(57) ABSTRACT

Data convolution for geographically diverse storage is disclosed. Data and corresponding convolutions of data can employ erasure coding to improve robustness of access to information represented in the data. For a peer group of chunks employing a given erasure coding scheme, access to the information represented in the data can be via accessible chunks and/or recovery of a less-accessible chunk, e.g., via a deconvolution operation, via a decoding operation, via a mix of deconvolution and decoding operations. The mix of deconvolution and decoding operations can enable recovery of a less-accessible chunk that cannot be recovered by either a deconvolution or decoding operation alone. This can improve access to information represented in less-available data.

20 Claims, 10 Drawing Sheets

(56) References Cited

U.S. PATENT DOCUMENTS

2016/0371145 A1* 12/2016 Akutsu ............... G06F 11/1076
2017/0064048 A1*  3/2017 Pettit .................... H04L 45/742
2018/0181324 A1*  6/2018 Danilov ............... G06F 3/0631
2019/0317858 A1* 10/2019 Danilov ............. H03M 13/373
2019/0332266 A1* 10/2019 Danilov ................ G06F 3/0652
2019/0384499 A1* 12/2019 Danilov ................. G06F 3/064

* cited by examiner

US 11,349,500 B2

DATA RECOVERY IN A GEOGRAPHICALLY DIVERSE STORAGE SYSTEM EMPLOYING ERASURE CODING TECHNOLOGY AND DATA CONVOLUTION TECHNOLOGY

TECHNICAL FIELD

The disclosed subject matter relates to data recovery and, more particularly, to data recovery in a geographically diverse storage system that convolves chunks and that employs erasure coding techniques to protect fragments of stored chunks.

BACKGROUND

Conventional data storage techniques can employ convolution and deconvolution of data to conserve storage space. As an example, convolution can allow data to be packed or hashed in a manner that uses less space that the original data. Accordingly, a convolution of first data and second data, etc., can typically be de-convolved to the original first data and second data. Moreover, other conventional data storage techniques can employ erasure coding to protect stored data. One use of data storage is in bulk data storage.

DETAILED DESCRIPTION

Figure 1:
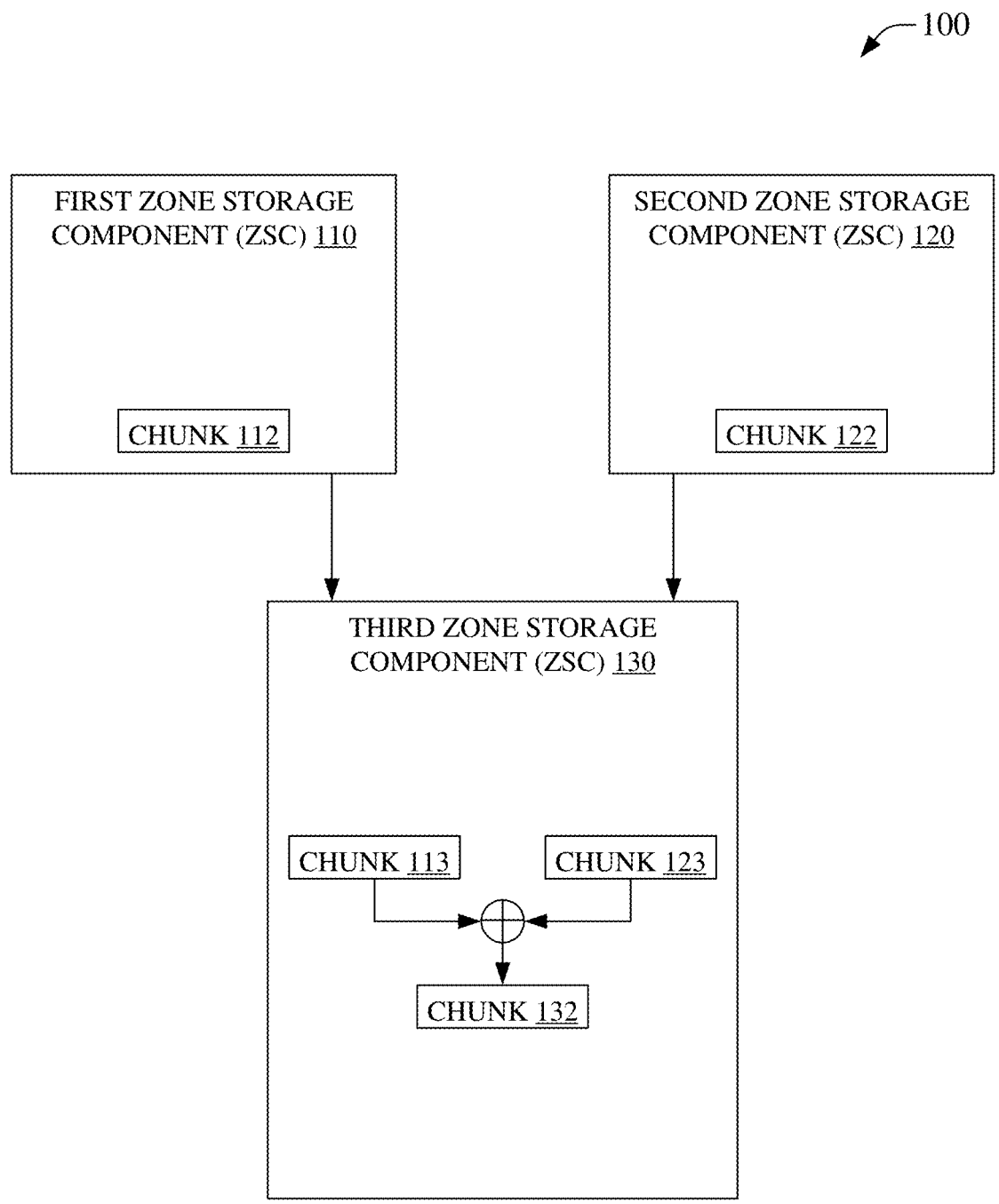
FIG. 1 is an illustration of an example system that can facilitate data convolution for geographically diverse storage, in accordance with aspects of the subject disclosure.

The subject disclosure is now described with reference to the drawings, wherein like reference numerals are used to refer to like elements throughout. In the following description, for purposes of explanation, numerous specific details are set forth in order to provide a thorough understanding of the subject disclosure. It may be evident, however, that the subject disclosure may be practiced without these specific details. In other instances, well-known structures and devices are shown in block diagram form in order to facilitate describing the subject disclosure.

As mentioned, data storage techniques can employ convolution and deconvolution to conserve storage space. As an example, convolution can allow data to be packed or hashed in a manner that uses less space that the original data. Moreover, convolved data, e.g., a convolution of first data and second data, etc., can typically be de-convolved to the original first data and second data. One use of data storage is in bulk data storage. Examples of bulk data storage can include networked storage, e.g., cloud storage, for example ECS, formerly 'Elastic Cloud Storage,' offered by Dell EMC. Bulk storage can, in an aspect, manage disk capacity via partitioning of disk space into blocks of fixed size, frequently referred to as chunks, for example a 128 MB chunk, etc. Chunks can be used to store user data, and the chunks can be shared among the same or different users, for example, one chunk may contain fragments of several user objects. A chunk's content can generally be modified in an append-only mode to prevent overwriting of data already added to the chunk. As such, when a typical chunk becomes full enough, it can be sealed so that the data therein is generally not available for further modification. These chunks can be then stored in a geographically diverse manner to allow for recovery of the data where a first copy of the data is destroyed, e.g., disaster recovery, etc. Blocks of data, not strictly user data, hereinafter 'data chunks', 'journal chunks', 'convolved chunks', or simply 'chunks' unless otherwise explicitly or implicitly directed to a specific type of chunk, can be used to store data, e.g., user data, operational data, parameter, data map information, etc., facilitate storage of user data, enable protection of user data, etc. Storage in a chunk(s) can be shared among the same or different users, e.g., a typical data chunk can contain fragments of different user data objects, a typical journal chunk can store information facilitating geographically diverse, and/or convolved geographically diverse data storage, a typical convolved chunk can store information pertaining to portions of two or more chunks, e.g., data chunks, journal chunks, convolved chunks, etc. As an example, a convolved chunk can comprise information corresponding to another convolved chunk, a data chunk, etc. Chunk contents can be modified, for example, in an append-only mode to prevent overwriting of data already added to the chunk, etc. As such, for a typical append-only chunk that is determined to be full, the data therein is generally not able to be further modified. Eventually the chunk, copies thereof, replicates, convolutions thereof, etc., can be stored 'off-site', e.g., in a geographically diverse manner, to provide for disaster recovery, etc. Chunks from a data storage device, e.g., 'zone storage component', 'zone storage device', etc., located in a first geographic location, hereinafter a 'zone', etc., can be stored in a second zone storage device that is located at a second geographic location different from the first geographic location. This can enable recovery of data where the first zone storage device is less available, e.g., damaged, destroyed, offline, etc., thereby supporting disaster recovery of data, etc., by accessing the off-site data from the second zone storage device.

Geographically diverse data storage can use data compression to store data. As an example, a storage device in Topeka can store a backup of data from a first zone storage device in Houston, e.g., Topeka can be considered geographically diverse from Houston. As a second example, data chunks from Seattle and San Jose can be stored in Denver. The example Denver storage can be compressed or uncompressed, wherein uncompressed indicates that the Seattle and San Jose chunks are replicated in Denver, and wherein compressed indicates that the Seattle and San Jose chunks, for example, can be convolved with each other, etc., for example via an 'XOR' operation, into a different chunk to allow recovery of the Seattle or San Jose data from the convolved chunk, but where the convolved chunk typically consumes less storage space than the sum of the storage space for both the Seattle and San Jose chunks individually. In an aspect, compression can comprise convolving data and decompression can comprise deconvolving data, hereinafter the terms compress, compression, convolve, convolving, etc., can be employed interchangeably unless explicitly or implicitly contraindicated, and similarly, decompress, decompression, deconvolve, deconvolving, etc., can be used interchangeably. Compression, therefore, can allow original data to be recovered via decompression from a compressed chunk that consumes less storage space than storage of the corresponding or participating uncompressed data chunks. This can be beneficial in that data from a location can be backed up by redundant data in another location via a compressed chunk, wherein a redundant data chunk can be smaller than the sum of the data chunks contributing to the compressed chunk. As such, local chunks, e.g., chunks from different zone storage devices, can be compressed via a convolution technique to reduce the amount of storage space used by a compressed chunk at a geographically distinct location.

A convolved chunk stored at a geographically diverse storage device can comprise data from some or all storage devices of a geographically diverse storage system. As an example, where there are five storage devices, a first storage device can convolve chunks from the other four storage devices to create a 'backup' of the data from the other four storage devices. In this example, the first storage device can create a backup chunk by convolving chunks received from the other four storage devices. In an aspect, this can result in generating copies of the four received chunks at the first storage device and then convolving the four chunks to generate a fifth chunk that is a backup of the other four chunks. Moreover, one or more other copies of the four chunks can be created at the first storage device for redundancy, for example if each chunk has two redundant chunks created, then the four received chunks and their redundant copies can result in creating 12 chunks at the first storage device before creating the convolved chunk that can then also be redundantly copied resulting in 15 chunk creation events. Further, the 12 now redundant copies of the four received chunks can then be deleted, e.g., the storage space can be released for reuse, the corresponding storage space can be overwritten and released, etc., leaving just the convolved chunk and related redundant convolved chunk.

In an embodiment of the disclosed subject matter, a first data chunk and a second data chunk corresponding to a first and second zone that are geographically diverse can be stored in a third data chunk stored at third zone that is geographically diverse from the first and second zones, for example see system 100. In an aspect the third chunk, for example chunk 132 of system 100, can represent the data of the first and second data chunks in a compressed form, e.g., the data of the first data chunk and the second data chunk can be convolved, such as by an XOR function, into the third data chunk, for example, chunk 112 can be replicated as chunk 113, chunk 122 can be replicated as chunk 123, and chunks 113 and 123 can be convolved to generate chunk 132, whereby chunk 132 can represent the data of chunks 112 and 122 in a compressed format for example system 100. Chunks 113 and 123 can then be deleted, freed, etc. In some embodiments, first data of the first data chunk and second data of the second data chunk can be convolved with or without replicating the entire first data chunk and the entire second data chunk at data store(s) of the third zone, e.g., as at least a portion of the first data chunk and at least a portion of the second data chunk are received at the third zone, they can be convolved to form at least a portion of the third data chunk. Where compression occurs without replicating a chunk at another zone prior to compression, this can be termed as 'on-arrival data compression' and can reduce the count of replicate data made at the third zone and data transfers events can correspondingly also be reduced. As an example, chunk 112 and chunk 122 can be on-arrival convolved into chunk 132, e.g., without forming chunk 113 and chunk 123. In some embodiments, replicates of the third data chunk can be stored in a data store(s) of the third zone. As an example, chunk 132 can be stored in third zone storage component (ZSC) 130, replicated as another chunk in ZSC 130, replicated in another zone, etc. In an aspect, a ZSC can comprise one or more data storage components that can be communicatively coupled, e.g., a ZSC can comprise one data store, two or more communicatively coupled data stores, etc., such that the replication of data in the ZSC can provide data redundancy in the ZSC, for example, providing protection against loss of one or more data stores of the ZSC. As an example, a ZSC can comprise multiple hard drives and data replicates can be stored on more than one hard drive such that, if a hard drive fails, other hard drives of the ZSC can still enable access to a data replicate.

Compression of chunks can be performed by different compression technologies. Logical operations can be applied to chunk data to allow compressed data to be recoverable, e.g., by reversing the logical operations to revert to the initial chunk data. One possible compression technique can be an 'exclusive-or' technique. Exclusive-or convolution can hereinafter be denoted as 'XOR', '⊕', etc. As an example, data from chunk 1 can undergo an XOR operation with data from chunk 2 to form chunk 3. As another example, if a first chunk comprises '00110011' and a second chunk comprises '11010101', then an XOR convolved chunk can comprise '11100110', e.g., 00110011⊕11010101=11100110. In this example, deconvolving can result in recovery of data, e.g., the first chunk XOR'ed with the convolved chunk can generate the second chunk or 00110011⊕11100110=11010101. While other logical and/or mathematical operations can be employed in compression of chunks, those operations are generally beyond the scope of the presently disclosed subject matter and, for clarity and brevity, only the XOR operator will be illustrated herein. However, it is noted that the disclosure is not so limited and that those other operations or combinations of operations can be substituted without departing from the scope of the present disclosure. As such, all logical and/or mathematical operations for compression germane to the disclosed subject matter are to be considered within the scope of the present disclosure even where not explicitly recited for the sake of clarity and brevity.

In an aspect, the presently disclosed subject matter can include 'zones'. A zone can correspond to a geographic location or region. As such, different zones can be associated with different geographic locations or regions. As an example, Zone A can comprise Seattle, Wash., Zone B can comprise Dallas, Tex., and, Zone C can comprise Boston, Mass. In this example, where a local chunk from Zone A is replicated, e.g., compressed or uncompressed, in Zone C, an earthquake in Seattle can be less likely to damage the replicated data in Boston. Moreover, a local chunk from Dallas can be convolved with the local Seattle chunk, which can result in a compressed/convolved chunk, e.g., a partial or complete chunk, which can be stored in Boston. As such, either the local chunk from Seattle or Dallas can be used to de-convolve the partial/complete chunk stored in Boston to recover the full set of both the Seattle and Dallas local data chunks. The convolved Boston chunk can consume less disk space than the sum of the Seattle and Dallas local chunks. An example technique can be XOR, where the data in the Seattle and Dallas local chunks can be convolved by XOR processes to form the Boston chunk, e.g., $C=A1 \oplus B1$, where A1 is a replica of the Seattle local chunk, B1 is a replica of the Dallas local chunk, and C is the convolution of A1 and B1. Of further note, the disclosed subject matter can further be employed in more or fewer zones, in zones that are the same or different than other zones, in zones that are more or less geographically diverse, etc. As an example, the disclosed subject matter can be applied to data of a single disk, memory, drive, data storage device, etc., without departing from the scope of the disclosure, e.g., the zones represent different logical areas of the single disk, memory, drive, data storage device, etc. Moreover, it will be noted that convolved chunks can be further convolved with other data, e.g., $D=C1 \oplus E1$, etc., where E1 is a replica of, for example, a Miami local chunk, E, C1 is a replica of the Boston partial chunk, C, from the previous example and D is an XOR of C1 and E1 located, for example, in Fargo.

In an aspect, XORs of data chunks in disparate geographic locations can provide for de-convolution of the XOR data chunk to regenerate the input data chunk data. Continuing a previous example, the Fargo chunk, D, can be de-convolved into C1 and E1 based on either C1 or D1; the Miami chunk, C, can be de-convolved into A1 or B1 based on either A1 or B1; etc. Where convolving data into C or D comprises deletion of the replicas that were convolved, e.g., A1 and B1, or C1 and E1, respectively, to avoid storing both the input replicas and the convolved chunk, de-convolution can rely on retransmitting a replica chunk that so that it can be employed in de-convoluting the convolved chunk. As an example the Seattle chunk and Dallas chunk can be replicated in the Boston zone, e.g., as A1 and B1. The replicas, A1 and B1 can then be convolved into C. Replicas A1 and B1 can then be deleted because their information is redundantly embodied in C, albeit convolved, e.g., via an XOR process, etc. This leaves only chunk C at Boston as the backup to Seattle and Dallas. If either Seattle or Dallas is to be recovered, the corollary input data chunk can be used to de-convolve C. As an example, where the Seattle chunk, A, is corrupted, the data can be recovered from C by de-convolving C with a replica of the Dallas chunk B. As such, B can be replicated by copying B from Dallas to Boston as B1, then de-convolving C with B1 to recover A1, which can then be copied back to Seattle to replace corrupted chunk A.

In some circumstances, disk space management can seek to recover underutilized disk space. As an example, where the Seattle chunk, A, is to be deleted, recovery of the Dallas chunk, B, via Boston convolved chunk, C, becomes dependent on having a copy of B to de-convolve C with after A has been deleted. As such, it can be desirable to deconvolve C into A1 and B1 prior to deleting A and A1, such that B1 can be convolved with another chunk, for example Miami chunk, E. As such, recovery of B1 can be based on E1 and the XOR of B1E1. Also of note, to de-convolve C in to A1 and B1, a replica of A, e.g., A1 is made in Boston, this allows recovery of B1. Once B1 is recovered, C, A1, and A can be deleted. Then B1 can be convolved with E1. It will be noted that data is transferred, e.g., A is copied into A1 from Seattle to Boston, to allow C to be de-convolved.

Additionally, in an aspect, erasure coding can be employed to protect data in a geographically diverse data storage system. Erasure coding can divide a data portion (D) into k data segments, fragments, etc. As an example, a chunk can be divided into 12 data segments or fragments, e.g., where k=12. During an encoding operation, m redundant coding segments, fragments, etc., can be created. Continuing the above example, four coding fragments can be generated based on the 12 data fragments of the chunk for a total of 16 fragments, e.g., k+m=12+4=16. In another example, for k=10 and m=2, k+m=10. Encoding can assure that a loss of up to any m segments of the k+m segments can be tolerated without loss of data access. If up to m segments are lost or become less accessible (hereinafter simply 'lost' unless otherwise explicitly indicated otherwise), the missing segments can be restored via a decoding operation. An erasure coding protection scheme can be identified as resulting in k+m data segments, e.g., k data segment and m coding segments result for a single data portion of a protection set, e.g., for a data chunk, etc., see, for example, Chunk 212A of first ZSC 212 in system 200 of FIG. 2 having k=12 and m=4 for 12 data segments and four coding segments under a 12+4 erasure coding scheme of chunk 212. As an alternate example, Chunk 212B of first ZSC 212 in system 200 of FIG. 2 having k=10 and m=2 for 10 data segments and two coding segments under a 10+2 erasure coding scheme of chunk 212. Any erasure coding scheme is expressly within the scope of the instant disclosure, even where not recited for the sake of clarity and brevity.

Rather than simply duplicating chunks between zones of a geographically diverse data storage system, even with convolution, erasure encoding can reduce the amount of data that needs to be accessed, communicated, processed, stored, etc., to facilitate a designated level of data robustness in the geographically diverse data storage system. For example, without erasure coding, for p+1 geographically distributed zones, there can be manipulation of at least p+1 chunks, for example, of 128 MB each, which can be computer resource intensive where more than a small number of chunks are compromised. With erasure encoding, the p+1 chunks can be encoded into fewer coding chunks that can consume less storage space and can be communicated/accessed with less computer resources than the p+1 chunks, for example, in a 4+2 erasure coding scheme, two coding chunks can be distributed to provide data protection rather than replicating and storing greater numbers of replicate chunks. Then, in this example, the coding chunks can be used to recover data rather than having to use the larger number of replicate chunks of a non-erasure coding system.

In an aspect, use of erasure coding, e.g., instead of basic XOR techniques, etc., to protect data in a geographically diverse storage system can be beneficial, for example by reducing computer resource demands in storing, recovering, etc., data chunks or portions thereof. Historically, erasure coding was created as a forward error correction method for binary erasure channels. However, more recently early attempts have been made to use erasure coding for data protection. Generally, erasure coding can divide a data portion, into k data fragments of equal size. During erasure coding encoding operations, m coding fragments can be created, which can enable access to data of the data portion, e.g., data of a data portion that has been erasure encoded into k+m fragments can be accessible with loss of up to m fragments, for example, in a 12+4 encoding, data can still be accessed despite the loss of up to four data fragments, four coding fragments, two data and two coding fragments, etc. It can be said that the way the encoding is done can assure that a system can tolerate the loss of any m fragments. The process of generating coding fragments can be referred to as 'encoding.' The process of recovering data fragments from an encoded data portion, e.g., using available data fragments and/or coding fragments, can be termed 'decoding.'

However, erasure coding technology can be employed in conjunction with, rather than instead of, convolution technology. In an aspect, erasure coding can protect chunks, including convolved chunks distributed in a geographically diverse data storage system. As such, where a chunk can suffer loss of some fragments, these fragments can be recovered with erasure coding decoding to restore the chunk, whereby the chunk can participate in deconvolutions to access data in the geographically diverse data storage system. As an example, a third chunk 'C' can comprise a convolution of a first 'A' and second 'B' chunk, where the chunks are protected by a 12+4 erasure coding scheme. In this example, where the third chunk is damaged and loses two fragments, erasure coding can enable recovery of the two lost fragments because m=4 which is greater than 2, e.g., the chunk can withstand the loss of any four fragments and has only lost two fragments and erasure coding can therefore recover these two lost fragments. This can restore the example third chunk. Accordingly, in this example, where before the third chunk is restored, the first chunk is lost, access to the information represented by the first chunk can be lost, e.g., the first chunk is lost and the third chunk is damaged so as to prevent recovery of the first chunk via deconvolving the second and third chunks to recover the information represented in the first chunk, where 1) A XOR B=C, then 2) B XOR C=A, but where C is damaged #2 cannot be performed. Therefore, recovery of C via erasure coding recovery, e.g., decoding, can restore C such that #2 can be performed.

In an aspect, where a group of related chunks, hereinafter a 'peer group', all employ a same erasure coding scheme, convolution operations, e.g., XOR, etc., can also apply to the reassure coding fragments. A peer group of chunks can be a group of chunks related to a convolution operation. As an example, for chunks A, B, C, D, E, etc., where A XOR B=C, then a first peer group can comprise A, B, and C, but can exclude D and E. As another example, for chunks A, B, C, D, E, etc., where A XOR B=C, and where C XOR D=E, then a first peer group can comprise A, B, and C, but can exclude D and E and a second peer group can comprise C, D, and E but can exclude A and B, albeit information represented in A and B are indeed nested within the second peer group via C.

For a peer group, an encoded convolved chunk can comprise data corresponding to convolving contributing chunk fragments. As an example, where A XOR B=C, and C' is an encoding of chunk C according to a first erasure coding scheme, then C'=(A' XOR B'), e.g., encoded chunk C is the XOR of encoded chunk A and encoded chunk B, where A' is chunk A encoded according to the first erasure coding scheme and B' is chunk B encoded according to the first erasure coding scheme. Moreover, fragments of C' can be the same as a convolution of the corresponding fragments of A' and B' in this example, which can be written as, $X_i^C = X_i^A \oplus X_i^B$. As an example, a fifth fragment of chunk A' convolved with a fifth fragment of chunk B' is the same as the fifth fragment of C' where chunk A⊕chunk B=chunk C. In an aspect, this is true where a chunk is convolved before encoding, e.g., first (A⊕B=C) then encode A, B, and C→A', B', and C'. In another aspect, this is also true where chunks are encoded before convolving, e.g., first encode A, B, and C→A', B', and C', then (A'⊕B'=C').

To the accomplishment of the foregoing and related ends, the disclosed subject matter, then, comprises one or more of the features hereinafter more fully described. The following description and the annexed drawings set forth in detail certain illustrative aspects of the subject matter. However, these aspects are indicative of but a few of the various ways in which the principles of the subject matter can be employed. Other aspects, advantages, and novel features of the disclosed subject matter will become apparent from the following detailed description when considered in conjunction with the provided drawings.

FIG. 1 is an illustration of a system 100, which can facilitate data convolution for geographically diverse storage, in accordance with aspects of the subject disclosure. System 100 can comprise three or more zone storage components (ZSCs), e.g., first ZSC 110, second ZSC 120, third ZSC 130, etc. The ZSCs can communicate with the other ZSCs of system 100. A zone can correspond to a geographic location or region. As such, different zones can be associated with different geographic locations or regions. A ZSC can comprise one or more data stores in one or more locations. In an aspect, a ZSC can store at least part of a data chunk on at least part of one data storage device, e.g., hard drive, flash memory, optical disk, cloud storage, etc. Moreover, a ZSC can store at least part of one or more data chunks on one or more data storage devices, e.g., on one or more hard disks, across one or more hard disks, etc. As an example, a ZSC can comprise one or more data storage devices in one or more data storage centers corresponding to a zone, such as a first hard drive in a first location proximate to Miami, a second hard drive also proximate to Miami, a third hard drive proximate to Orlando, etc., where the related portions of the first, second, and third hard drives correspond to, for example, a 'Miami zone'.

In an aspect, data chunks can be replicated in their source zone, in a geographically diverse zone, in their source zone and one or more geographically diverse zones, etc. As an example, a Seattle zone can comprise a first chunk that can be replicated in the Seattle zone to provide data redundancy in the Seattle zone, e.g., the first chunk can have one or more replicated chunks in the Seattle zone, such as on different storage devices corresponding to the Seattle zone, thereby providing data redundancy that can protect the data of the first chunk, for example, where a storage device storing the first chunk or a replicate thereof becomes compromised, the other replicates (or the first chunk itself) can remain uncompromised. As an example, chunk 212 in FIG. 2 can be replicated in first ZSC 210 as chunks 214, 216, etc. In an aspect, data replication in a zone can be on one or more storage devices, e.g., chunk 212 can be stored on a first data storage device, chunk 214 can be stored on a second storage device, and chunk 216 can be stored on a third storage device, wherein the first, second, and third storage devices correspond to the first zone, and wherein the first, second, and third storage devices can be the same storage device or different storage devices. Replication of chunks, e.g., chunk 212 into chunks 214, 216, etc., can comprise communicating data, e.g., over a network, bus, etc., to other data storage locations on the first, second, and third storage devices and, moreover, can consume data storage resources, e.g., drive space, etc., upon replication. As such, the number of replicates can be based on balancing resource costs, e.g., network traffic, processing time, cost of storage space, etc., against a level of data redundancy, e.g., how much redundancy is needed to provide a level of confidence that the data/replicated data will be available within a zone.

A geographically diverse storage system, e.g., a system comprising system 100, can create a replicate of a first chunk, e.g., chunk 112, at a geographically diverse ZSC, for example, chunk 113 at third ZSC 130, etc. The replicate at the geographically diverse ZSC can provide data redundancy at a different level than the level associated with data replicates within a single ZSC. As an example, where first ZSC 110 is affiliated with a Seattle zone, and third ZSC 130 is affiliated with a Boston zone, then a regional event that compromises chunk 112 in the Seattle zone can be less likely to also compromise chunk 113 in the Boston zone.

In an aspect, replication of chunks between different zones of system 100 can consume data storage resources, e.g., network traffic, data storage space, processor time, energy, manpower, etc. As an example, replication of chunk 112 and chunk 122 at third ZSC 130, e.g., as chunk 113 and chunk 123 respectively, can consume processing cycles at each of the first to third ZSCs 110, 120, and 130, can consume network resources to communicate the data between the first to third ZSCs 110, 120, and 130, can consume data storage space/resources at each of the first to third ZSCs 110, 120, and 130, etc. Moreover, where, as illustrated, a ZSC, e.g., ZSC 130, stores replicates of chunks from other zones, e.g., ZSCs 110 and 120, the replicated chunks, e.g., chunk 113 and chunk 123, can occupy a first amount of storage space, e.g., chunks 113 and 123 consume a first amount of storage space on storage device(s) of third ZSC 130. Compression of the redundant data can reduce the amount of consumed storage space while preserving the redundancy of the data. As an example, chunk 113 and chunk 123 can be compressed into chunk 132 that can consume less data storage space than the space associated with separately storing each of chunk 113 and chunk 123. In an embodiment, compression can be via an XOR operation of chunk 113 and chunk 123, e.g., 'chunk 132=chunk 113 XOR chunk 123,' etc. Thereafter, in some embodiments, chunks 113 and 123 can be deleted, e.g., the space used by chunks 113 and 123 can be freed, released, reclaimed, etc., for other uses.

Figure 2:
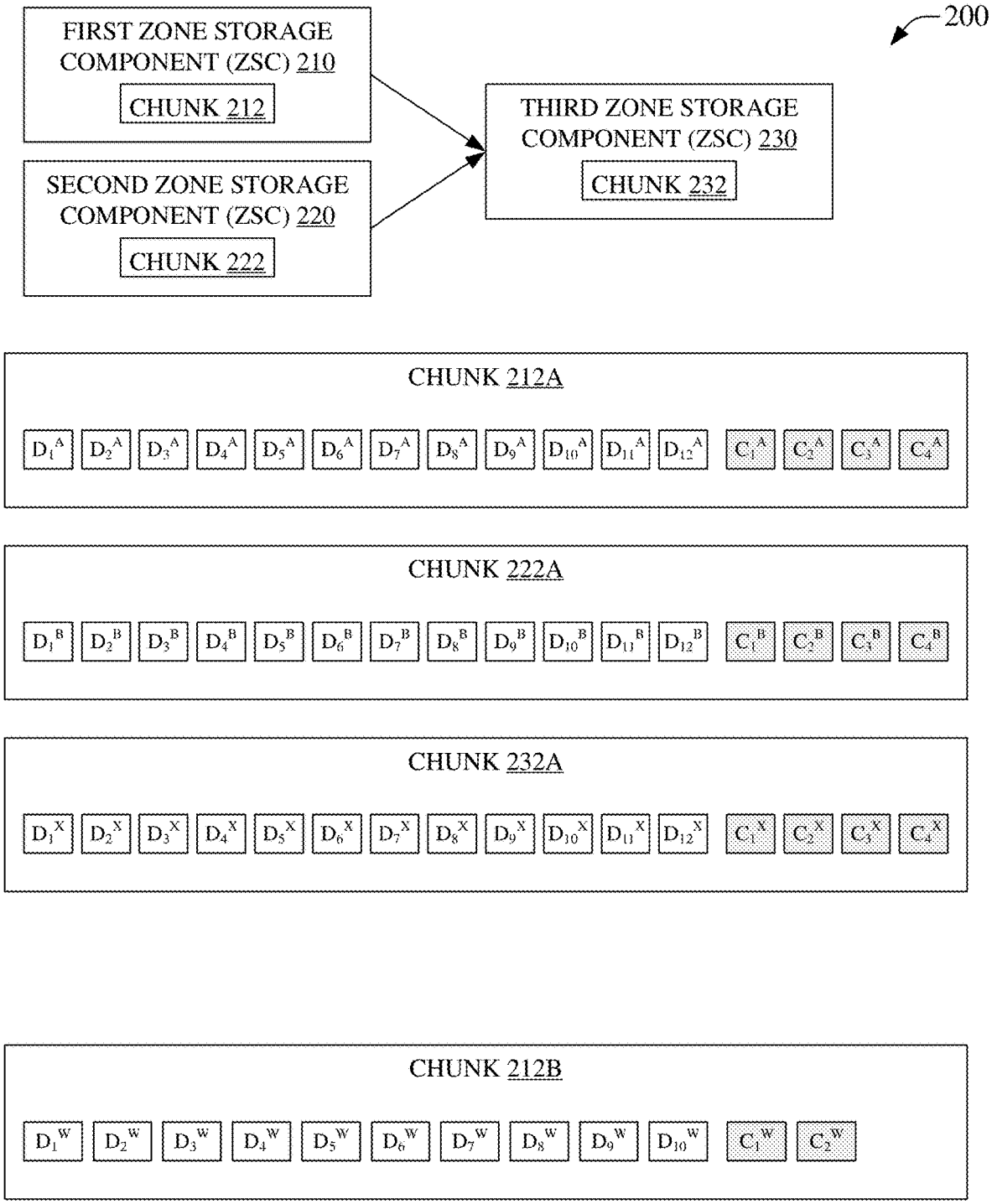
FIG. 2 is an illustration of an example system that can facilitate data convolution and erasure coding of chunks for geographically diverse storage, in accordance with aspects of the subject disclosure.

FIG. 2 is an illustration of an example system 200 that can facilitate data convolution and erasure coding of chunks for geographically diverse storage, in accordance with aspects of the subject disclosure. System 200 can comprise three ZSCs, e.g., first ZSC 210, second ZSC 220, third ZSC 230, etc., which can be comprise in a geographically diverse storage system. Chunks 212 and 222 can be replicated and compressed as chunk 232, e.g., chunk 232 can comprise information enabling recovery of chunks 212 or 222 via deconvolution. In an aspect, if any one ZSC becomes less accessible, the information represented in chunks 212 and/or 222 can remain accessible. As an example, if ZSC 230 becomes less accessible, chunks 212 and 222 can remain accessible via ZSC 210 and 220 respectively. As another example, if ZSC 210 becomes less accessible the information represented in chunk 212 can be recovered via deconvolving chunk 232 with chunk 222. These examples can illustrate protection of data against loss of any one zone. Accordingly, chunks 212, 222, and 232 can be regarded as a peer group. Where two chunks of the peer group become less accessible, for example where chunk 212 is lost and where chunk 232 is damaged, etc., recovery of data can be compromised, e.g., in this example, the information represented on chunk 212 cannot be recovered from chunk 222 and damaged chunk 232, etc.

However, where the peer group also employs erasure coding, the data can be recoverable. In an aspect, data can be recoverable via whole chunk deconvolution, e.g., where A XOR B=C, then C XOR B=A and C XOR A=B, as is disclosed above. In another aspect, data can be recoverable on a fragment level, e.g., where A' XOR B'=C', then C' XOR A'=B' and C' XOR B'=A', and any corresponding fragments can be recoverable via deconvolution. As an example, chunk 212A can be an encoding of chunk 212 according to a 12+4 erasure coding scheme, chunk 222A can be an encoding of chunk 222 according to the 12+4 erasure coding scheme, and chunk 232A can be an encoding of chunk 232 according to the 12+4 erasure coding scheme, which can allow fragment recovery of fragments, e.g., fragment $D_1^A$, etc., hereinafter written as 'D1A' for simplicity. As such, within chunk 212A, loss of up to any four fragments can be recovered, e.g., loss of D1A to D3A and C1A can be recovered via decoding within chunk 212A by employing the remaining fragments of chunk 212A according to the first example 12+4 erasure coding scheme. As such, any of chunks 212A to 232A can each lose up to m=4 fragments and data and can still be recovered at both the erasure coding level and the convolution level. As an example, where chunk 222A becomes unavailable and chunk 212A becomes damaged, e.g., loses D1A to D3A and C1A, conventionally, the data of chunk 222A would be regarded as being lost. However, where the loss of D1A to D3A and C1A can be recovered within chunk 212A via erasure coding to restore chunk 212A, then chunk 222A can be recovered by deconvolving chunk 232A and restored chunk 212A.

In another aspect, fragments of a chunk can be recovered from remaining fragments of other chunks in a peer group. In this aspect, corresponding peer group fragments can be deconvolved to recover other less accessible fragments. As an example, where chunk 212A loses D1A to D3A and C1A, then chunks D1B XOR D1X=D1A, etc., can allow recovery of the lost fragments of chunk 212A. Accordingly, each of D1A to D3A and C1A can be recovered from the peer group fragments, assuming that sufficient corresponding peer group fragments remain. However, where there are not enough corresponding peer group fragments, the data can again be regarded as lost, e.g., where chunk 212A loses D1A and chunk 232A loses D1X, then the remaining corresponding peer group fragment, e.g., D1B, is not sufficient to enable recovery of either D1A or D1X via peer fragment deconvolution, although, in this example, where all other fragments remain, erasure coding scheme decoding can facilitate recovery of D1A from the remaining fragments of chunk 212A and/or chunk D1X from the remaining fragments of 232A, and this in turn can enable peer fragment deconvolution to proceed. As such, it will be appreciated that losing more than m fragments of an encoded chunk and sufficient corresponding fragments of other peer group chunks can result in a fragment that is not directly recoverable via either decoding, nor directly via fragment deconvolution.

In an aspect, corresponding fragments in a peer group can be based on each chunk of the peer group employing a same erasure coding scheme. As is stated elsewhere herein, a chunk can be encoded according to nearly any erasure coding scheme. As an example, chunk 212 can be encoded according to a 12+4 erasure coding scheme, e.g., as illustrated in chunk 212A, according to a 10+2 erasure coding scheme, e.g., as illustrated in chunk 212B, or nearly any other erasure coding scheme. However, to enable fragment recovery as disclosed herein, each chunk of a peer group can use a same erasure coding scheme such that the fragments of a peer group correspond. As an example, chunk fragments of chunks 212A, 222A, and 232A can employ 12+4 erasure coding using, for example, bit-matrix coding, etc., such that a fragment of a first encoded chunk corresponds to other fragments of other encoded chunks of the peer group, e.g., D1A can correspond to D1B and D1X; D3X can correspond to D3A and D3B; C2B can correspond to C2A and C2X, etc., but chunk fragment D1A would not correspond to D2B, D2X, D5X, C2B, etc. Moreover, where chunk 212 is encoded as chunk 212B, then the 10+2 fragments, e.g., D1W to D10W and C1W to C2W, would not correspond to the 12+4 fragments of chunk 222A or chunk 232A even though chunk level deconvolution would still be operational, e.g., where 212B XOR 222A=232A then 232A XOR 212B=222A and 232A XOR 222A=212B even though D1W XOR D1B would not yield D1X, etc. In an aspect, corresponding fragments of peer group can be written as frag1:frag2:frag3 for a peer group of three chunks, e.g., for chunks A, B, and C, where A XOR B=C, then C'=A' XOR B', and D1A:D1B:D1X can be corresponding fragments of the peer group A, B, and C. Similarly, for a peer group employing the same erasure coding and having more than three chunks, e.g., R' XOR S' XOR T'=U', then D3R:D3S:D3T:D3T can be corresponding fragments of the peer group R, S, T, U, where R', S', T', and U' are correspondingly erasure coded R, S, T, and U.

Figure 3:
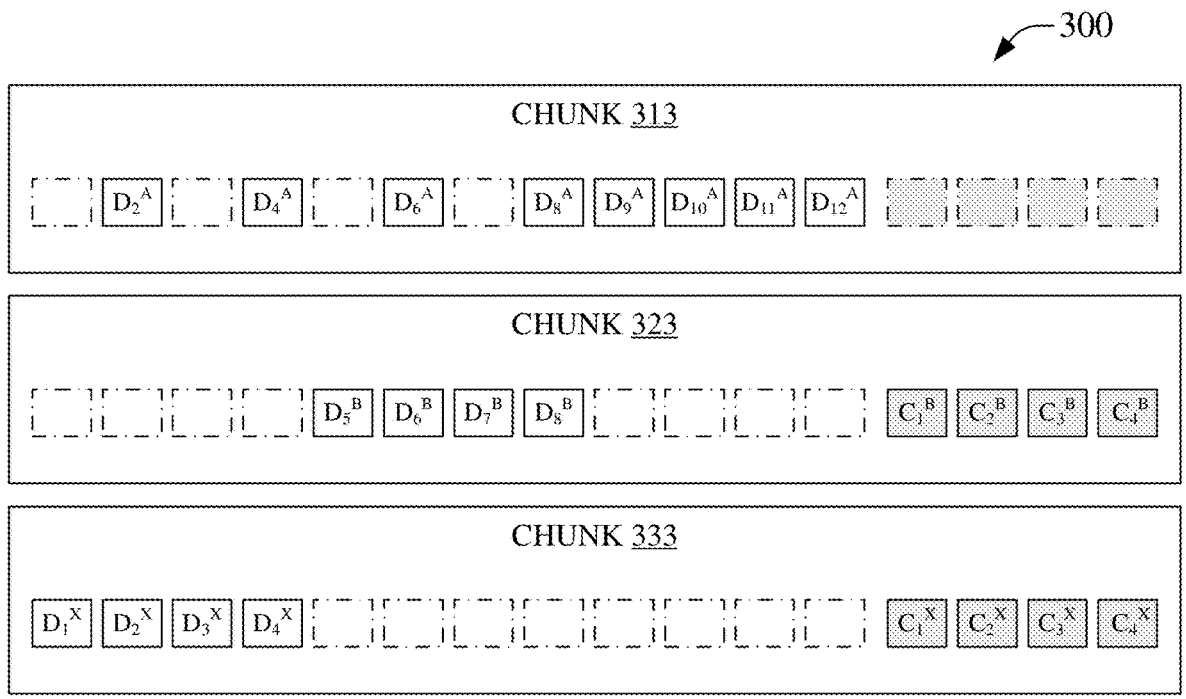
FIG. 3 illustrates an example system showing compromised data that cannot be recovered via deconvolution alone and cannot be recovered via erasure decoding alone, in accordance with aspects of the subject disclosure.
Figure 3:
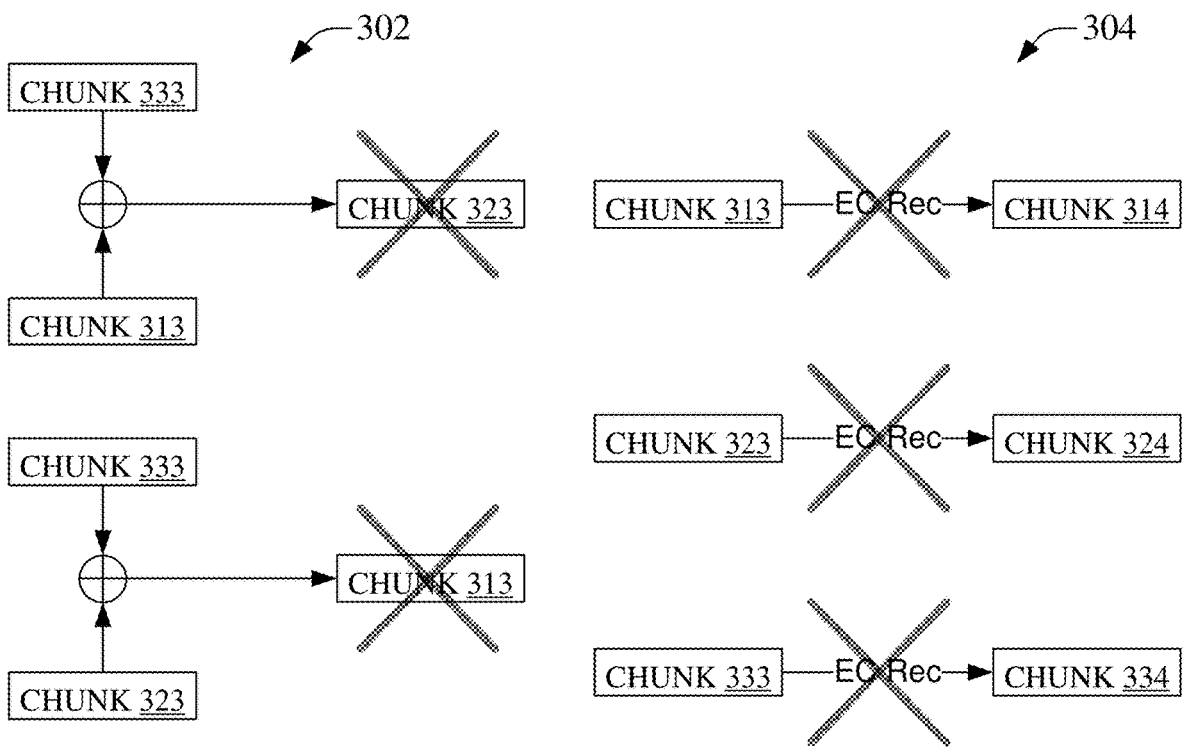

FIG. 3 is an illustration of a system 300, showing compromised data that cannot be recovered via deconvolution alone and/or cannot be recovered via erasure decoding alone, in accordance with aspects of the subject disclosure. System 300 can be a geographically diverse data storage system having zones that can store data comprising damaged chunks 313, 323, and 333 in a geographically diverse manner. Chunk 333, before the illustrated chunk damage, can be a convolution of chunks 313 and 323, also predamage. Moreover, chunks 313, 323, and 333 can be a peer group encoded according to a same example 12+4 erasure coding scheme. Accordingly, loss of, damage to, etc., any one chunk from the peer group can be recovered from via chunk level deconvolution as disclosed herein. Moreover, loss of up to m=4 fragments of any of one the peer group chunks can be recovered from in the chunk via decoding according to the 12+4 erasure coding scheme, also as disclosed herein. Further, any two corresponding peer group fragments can be employed to recover a lost fragment via fragment deconvolution in the peer group, again as disclosed herein. However, where the chunks of the peer group can be damaged in a manner that results in too few corresponding chunks to recover solely via fragment deconvolution, as is illustrated, a further recovery technology can be beneficial as is disclosed elsewhere herein.

System 300, at state 302, can comprise damaged chunks 313-333, whereby chunk level deconvolution recovery can fail. As an example, chunk 333 XOR chunk 313 can fail to result in chunk 323. As another example, chunk 333 XOR chunk 323 can fail to result in chunk 313. As such, with more than one damaged chunk in a peer group, chunk level deconvolution alone can fail to provide an avenue to recovery.

System 300, at state 304, can similarly comprise damaged chunks 313-333, whereby decoding according to an erasure coding scheme can fail to recover missing fragments of a chunk. As an example, chunk 313, employing a 12+4 erasure coding (EC) scheme, can tolerate a loss of up to m=4 fragments. However eight fragments have been lost in example damaged chunk 313. Accordingly, performing an erasure coding recovery (EC Rec) on the remaining fragments of chunk 313 can fail to yield chunk 314, wherein chunk 314 can comprise the information represented in chunk 313 before chunk 313 was damaged, e.g., chunk 314 cannot be recovered from chunk 313 via an EC Rec. Similarly, performing an EC Rec on chunk 323 can fail to produce chunk 324 that can be a recovered chunk 323; and performing an EC Rec on chunk 333 can fail to produce chunk 334 that can be a recovered chunk 333.

Figure 4:
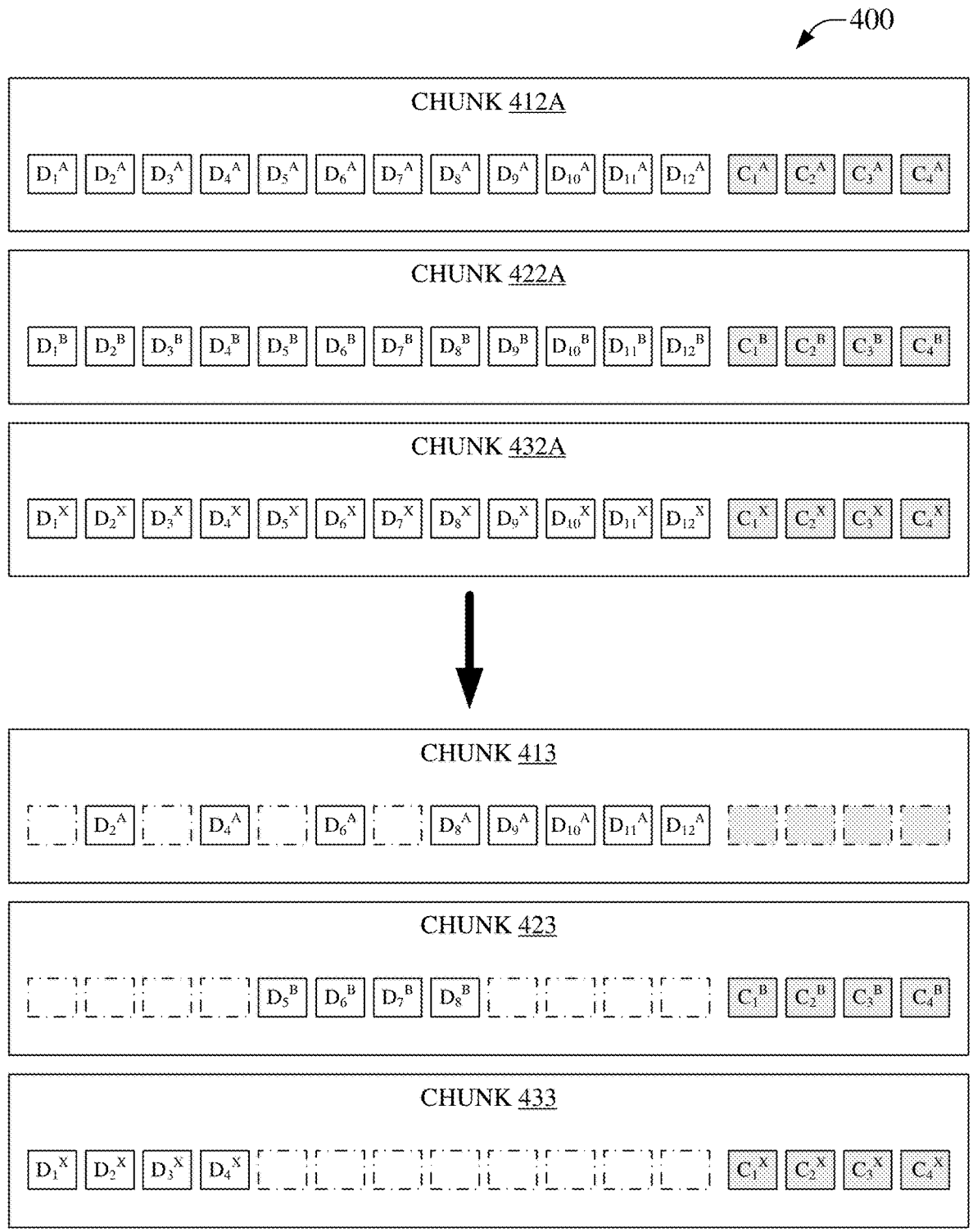
FIG. 4 is an illustration of an example system showing compromised data that can be recovered via mixed deconvolution and erasure decoding, in accordance with aspects of the subject disclosure.

FIG. 4 is an illustration of a system 400, showing compromised data that can be recovered via mixed deconvolution and erasure decoding, in accordance with aspects of the subject disclosure. System 400 can be a geographically diverse data storage system having zones that store data comprising chunks 412A, 422A, and 432A in a geographically diverse manner. Chunk 432A can be a convolution of chunks 412A and 423A. Moreover, chunks 412A to 432A can be encoded according to a same example 12+4 erasure coding scheme. As an example, a first zone can comprise encoded chunk 412A, a second zone can comprise encoded chunk 422A and a third zone can comprise encoded chunk 432A. Accordingly, loss of any one chunk from the peer group 412A, 422A, and 432A, can be recovered from via chunk level deconvolution. Moreover, loss of up to m=4 fragments of any of one the peer group chunks can be recovered from in the chunk via decoding according to the 12+4 erasure coding scheme. Further, any two corresponding peer group fragments can be employed to recover a lost fragment via fragment deconvolution in the peer group. However, where the chunks of the peer group can be damaged in a manner that results in too few corresponding chunks to enable fragment deconvolution, a further recovery technology can be beneficial. In an aspect, a mixed recovery, e.g., a mix of erasure coding recovery and deconvolution recovery, can provide additional recovery options for peer group chunks that have sustained sufficient damage to their data.

As is illustrated, damage to chunks 412A to 432A can result in chunks 413, 423, and 433 correspondingly. As is illustrated, each of chunks 413-433 can have sustained a loss of eight fragments, which is greater than the m=4 threshold for erasure coding recovery within a chunk and, additionally, the several peer group chunks are each damaged preventing chunk level deconvolution. As an example, the remaining fragments of chunk 413, e.g., D2A, D4A, D6A, etc., can be insufficient to allow recovery of the other missing fragments via deconvolution according to the 12+4 erasure coding scheme. Moreover, where chunks 423 and 433 are also damaged, chunk level deconvolution can also be infeasible, e.g., 433 XOR 423 can fail to produce 413, etc. Moreover, there are several examples of insufficient corresponding fragments for fragment deconvolution within the peer group, e.g., D1X of 433 can be insufficient, without a corresponding fragment, to recover missing D1A 413, e.g., without missing D1B of 423, etc. As such, the example damaged peer group chunks can be regarded as unrecoverable by either deconvolution alone and/or decoding alone.

However, another aspect of the presently disclosed subject matter can provide another recovery technology. As can be observed, there are some possibilities of fragment deconvolution recovery among chunks 413, 423, and 433. As an example, C1X XOR C1B can recover missing C1A. As another example, D8A XOR D8B can recover missing D8X. It will also be noted that where sufficient missing fragments can be recovered, then a chunk can perform recovery via decoding according to the erasure coding scheme of the chunk, e.g., where four fragments of chunk 413 can be recovered, chunk 413 can then have 12 fragments, e.g., eight undamaged fragments and four recovered fragments, and can undergo recovery via decoding within chunk 413. As an example, where fragments C1A to C4A can be recovered in chunk 413, then chunk 413 can recover missing D1A, D3A, D5A, and D7A within chunk 413 via decoding. Accordingly, in this example, fragments C1X to C4X of chunk 433 and fragments C1B to C4B of chunk 423 can be employed to recover missing fragments C1A to C4A of chunk 413 via peer group corresponding fragment deconvolution, e.g., C1X XOR C1B=missing C1A, etc. Where each of C1A to C4A can be recovered in this manner, then chunk 413 can employ decoding according to the erasure coding scheme to recover missing D1A, D3A, D5A, and D7A within chunk 413. As such, chunk 413 can be fully recovered. Similarly, the fragments of fully recovered chunk 413 can then be employed to populate missing fragments of chunk 423 and/or chunk 433. Where sufficient fragments for these chunks can be recovered, e.g., via fragment deconvolution, then these chunks can employ decoding to recover further missing fragments. This can be repeated to recover further missing chunks. The illustrated example peer group 413, 423, and 433 can, in fact, be fully recovered, even where, as is illustrated in FIG. 4, 50% of the fragments of each chunk of the peer group have been lost or otherwise become less available. This is a substantial improvement over conventional data storage technologies.

Figure 5:
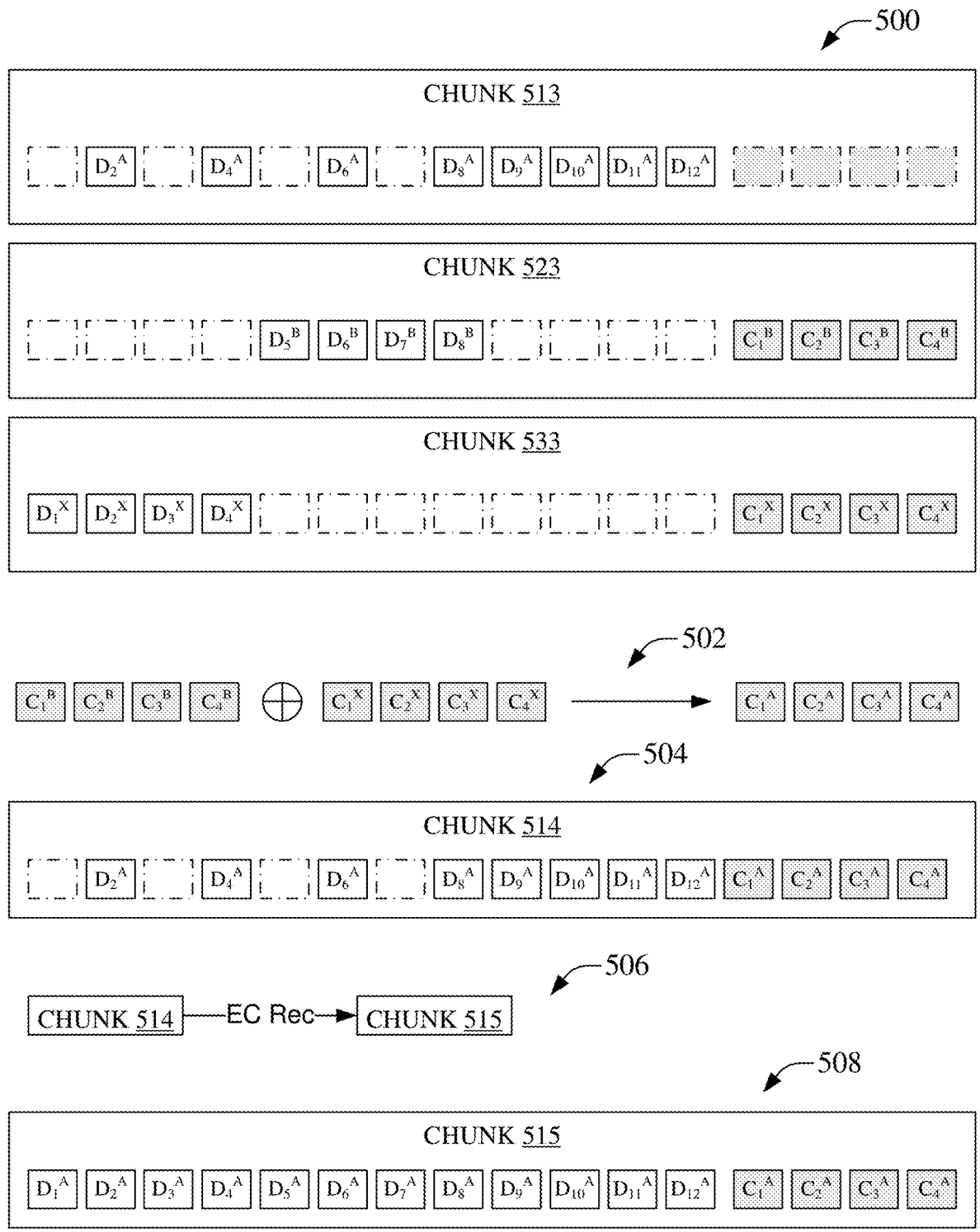
FIG. 5 illustrates an example system showing partial recovery of compromised data that can be recovered via mixed deconvolution and erasure decoding, in accordance with aspects of the subject disclosure.

FIG. 5 is an illustration of an example system 500 showing partial recovery of compromised data that can be recovered via mixed deconvolution and erasure decoding, in accordance with aspects of the subject disclosure. System 500 can be a geographically diverse data storage system having zones that store data comprising chunks in a geographically diverse manner. These chunks, or portions thereof, can be damaged, e.g., via power spikes, power drops, failed/failing memory cells, viruses, etc. Chunks can be convolved to be more storage space efficient. Moreover, chunks can be encoded according to an erasure coding scheme. A convolved chunk and corresponding participating chunks can be regarded as a peer group of chunks.

In an aspect, chunks 513, 523, and 533 can be damaged versions of chunks comprising a peer group. As an example, a first zone can comprise a first encoded chunk, a second zone can comprise a second encoded chunk, and a third zone can comprise a third encoded chunk. Accordingly, loss of any one chunk from the peer group, can be recovered from via chunk level deconvolution, e.g., where the recovering chunks are undamaged. Moreover, loss of up to m=4 fragments of any of one the peer group chunks can be recovered from in the chunk via decoding according to the applied erasure coding scheme. Further, any two corresponding peer group fragments can be employed to recover a lost fragment via fragment deconvolution across the peer group. However, where the chunks of the peer group can be damaged in a manner that results in too few corresponding chunks to enable fragment deconvolution, a further recovery technology can be beneficial. In an aspect, a mixed recovery, e.g., a mix of erasure coding recovery and deconvolution recovery can provide additional recovery options for peer group chunks that have sustained sufficient damage to their data.

As is illustrated, damaged chunks 513, 523, and 533 can each have sustained a loss of eight fragments, e.g., a 50% fragment loss, which can be greater than the m=4 threshold for the illustrated 12+4 erasure coding scheme. This can prevent decoding according to the example erasure coding scheme to recover missing fragments within any one of chunks 513, 523, and 533. Additionally, the several peer-group chunks are each illustrated as being damaged, which can prevent chunk level deconvolution. Moreover, the remaining fragments can be insufficient to allow recovery via fragment deconvolution. There are several examples of insufficient corresponding fragments for fragment deconvolution within the peer group, e.g., D1X of 533 can be insufficient, without a corresponding fragment, to recover missing D1A 513, e.g., without missing D1B of 523; D5B of 523 can be insufficient, without a corresponding fragment, to recover missing D5A 513, e.g., without missing D5X of 533; etc. As such, the example damaged peer group chunks 513-533 can be regarded as unrecoverable by either deconvolution alone and/or decoding alone.

However, as disclosed hereinabove, another aspect of the presently disclosed subject matter can provide another recovery technology. At state 502, system 500 can enjoy partial fragment deconvolution recovery, e.g., fragments C1B to C4B of chunk 523 can be deconvolved with fragments C1X to C4X of chunk 533 to recover missing fragments C1A to C4A of chunk 513. This can be regarded as a 'deconvolve first' iteration because some fragments are deconvolved across the peer group to support a subsequent decoding operation.

At state 504, system 500 can illustrate, that where sufficient missing fragments can be recovered, chunk 513 can perform, at state 506, further fragment recovery via decoding according to the erasure coding scheme of the chunk, e.g., where fragments C1A to C4A of chunk 513 are recovered at state 502, chunk 513, at state 504, can then have 12 fragments, e.g., eight undamaged fragments and four recovered fragments, and can undergo further recovery, at state 506, via decoding within chunk 513, to generate other missing fragments, e.g., as illustrated at state 508 where chunk 515 illustrates the recovery of damaged chunk 513. In chunk 515, missing fragments D1A, D3A, D5A, and D7A within chunk 513 have been recovered via decoding. Further iterations can be undertaken to recover other missing fragments of other chunks of the peer group, similar to, or the same as, is disclosed elsewhere herein, which can allow recovery of all missing fragments of damaged chunks 513, 523, 533, etc., in system 500. These additional iterations are not illustrated for the sake of brevity and clarity.

In an aspect, a 'decode first' iteration can also be enjoyed in some circumstances. As an example, although not illustrated for clarity and brevity, chunk 533 can be less damaged, for example only loosing D1X to D4X, thus comprising healthy fragments D5X to D12X and C1X to C4X. As such, recovery can proceed as disclosed herein above, e.g., via a 'deconvolve first' iteration to recover C1A to C4A of 513 based on C1B to C4B of chunk 523 and C1X to C4X of chunk 533. However, as an alternative, recovery can proceed via a 'decode first' iteration to recover fragments D1X to D4X of chunk 533 based on fragments D5X to D12X and C1X to C4X of chunk 533. This can result in a full recovery of chunk 533. Accordingly, recovered chunk 533 can participate in a subsequent deconvolve operation, for example, recovering missing D2B of chunk 523 based on fragment deconvolution with recovered D2X of chunk 533 and D2A of chunk 513. Similarly, missing D4B of chunk 523 can be recovered via fragment deconvolution with recovered D4X of chunk 533 and D4A of chunk 513. Further, fragment deconvolution recovery of C1A to C4A of 513 can be based on C1B to C4B of chunk 523 and C1X to C4X of chunk 533. Additionally, fragment deconvolution recovery of D9B to D12B of 523 can be based on D9A to D12A of chunk 513 and D9X to D12X of chunk 533. Where, after these further fragment deconvolutions, each of chunks 513 and 523 have at least k fragments, they can then recover other missing fragments, e.g., via respectively decoding based on their existing and recovered fragments. In an aspect, this can also result in full recovery. This illustrates that while system 500 is illustrated as fully recovering via a 'deconvolve first' iteration followed by a decode iteration, etc., it is possible to also recover via a 'decode first' iteration followed by a deconvolve iteration, etc.

Moreover, in some embodiments, more than one chunk can undergo a 'decode first' iteration before a subsequent deconvolve iteration. In some embodiments, the peer group can undergo more than one 'deconvolve first' iteration before a subsequent decode iteration is performed. In other embodiments, the decode and deconvolve iterations can be performed in nearly any combination to achieve recovery of an acceptable number of fragments. In an aspect, an order of decode/deconvolve iterations can be mapped to determine an estimated count of recovered fragments. As more than one particular order of operations can be performed, the corresponding estimated count of recovered fragments can be used to rank different possible orders of decode/deconvolve iterations, which can enable selecting a particular order that can result in a threshold level of recovery, e.g., an order of operations that results in maximizing the count of recovered fragments, that results in an acceptable count of recovered fragments with the lowest burden on computing resources of the system, etc.

Figure 6:
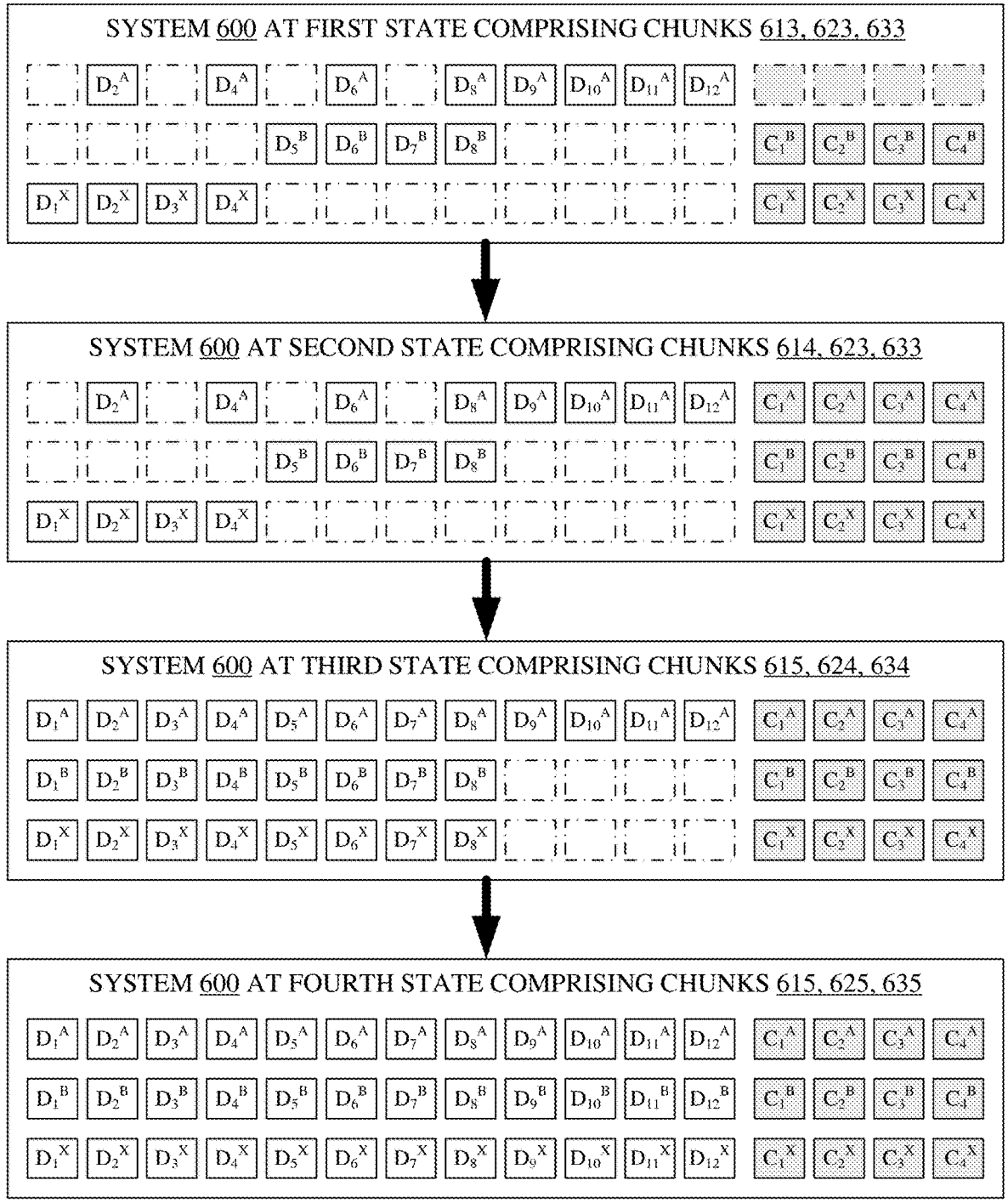
FIG. 6 illustrates an example system showing full recovery of compromised data that can be recovered via mixed deconvolution and erasure decoding, in accordance with aspects of the subject disclosure.

FIG. 6 is an illustration of example system 600 showing full recovery of compromised data that can be recovered via mixed deconvolution and erasure decoding, in accordance with aspects of the subject disclosure. System 600 can be a geographically diverse data storage system having zones that store data comprising chunks in a geographically diverse manner. Chunks can be convolved to be more storage space efficient. Moreover, chunks can be encoded according to an erasure coding scheme. A convolved chunk and corresponding participating chunks can be regarded as a peer group of chunks. These chunks, or portions thereof, can become damaged.

In an aspect, chunks 613, 623, and 633 of system 600 in a first state, corresponding to the first, second, and third rows of fragments illustrated, can be damaged versions of chunks of a peer group. As is illustrated, damaged chunks 613, 623, and 633 can each have sustained an example loss of eight fragments, e.g., a 50% fragment loss, which can be greater than the m=4 threshold for the illustrated 12+4 erasure coding scheme. This can prevent decoding according to the example erasure coding scheme to recover missing fragments within any one of chunks 613, 623, and 633. Additionally, the several peer-group chunks are each illustrated as being damaged, which can prevent chunk level deconvolution. Moreover, the remaining fragments can be insufficient to allow full recovery via only fragment deconvolution.

However, system 600 at second state, can enjoy partial fragment deconvolution recovery, e.g., fragments C1B to C4B can be deconvolved with fragments C1X to C4X to recover missing fragments C1A to C4A. This can be regarded as a 'deconvolve first' iteration. It is noted that chunk 614 comprises the remaining fragments of chunk 613 and the already noted recovered fragment deconvolve chunks.

System 600 at a third state can illustrate, that where sufficient missing fragments were recovered at the second state, chunk 614 can perform, further fragment recovery via decoding according to the erasure coding scheme of the chunk, e.g., chunk 615 can replace chunk 614 and can have no missing fragments. Additionally, in this third state of system 600, a fragment deconvolve iteration can be performed that can recover some fragments of chunk 623, e.g., chunk 624 can comprise the chunks of 623 and the chunks recovered by fragment deconvolution of D1A to D4A with D1X to D4X. In an aspect, fragment deconvolution can occur one fragment at a time or in other embodiments can occur as a single operation on a wider data fragment, e.g., a wide data fragment can be, for example four fragments wide to enable reduced iterations of fragment deconvolution operations, for example wide data fragment D1-4A, comprising the same information as D1A, D2A, D3A, D4A, can be XOR'ed with wide data fragment D1-4X, comprising the same information as D1X, D2X, D3X, D4X, to result in wide data fragment D1-4B which can comprise the same information as D1B, D2B, D3B, D4B.

At a fourth state, system 600 can illustrate full recovery of all missing fragments. In an embodiment, this can result from subsequent decoding at each of chunks 624 and 634 to correspondingly yield chunks 625 and 635. In another embodiment, this can result from subsequent decoding of chunks 624 to yield chunk 625, and subsequent fragment deconvolution of chunks 615 and 625 to recover the missing fragments of chunk 634 resulting in chunk 635. In a further embodiment, this can result from subsequent decoding of chunks 634 to yield chunk 635, and subsequent fragment deconvolution of chunks 615 and 635 to recover the missing fragments of chunk 624 resulting in chunk 625. Other embodiments can comprise other variations, permutations, etc., on the order of operations and are to be considered within the scope of the instant disclosure despite not being explicitly recited for the sake of clarity and brevity. In an aspect, a 'decode first' iteration can also be performed, as disclosed hereinabove, although not recited or illustrated for the sake of clarity and brevity. Accordingly, while system 600 is illustrated as fully recovering via a 'deconvolve first' iteration followed by a decode iteration, etc., it is possible to also recover via a 'decode first' iteration followed by a deconvolve iteration, etc. Moreover, in some embodiments, other orders of decode/deconvolve iterations can be performed. In some embodiments, orders of operations can be raked to enable selection of an order of operations that is in accord with operational goals, satisfies threshold criteria, etc., and all such permutations of operations, ranking of operations, ordering of operations, etc., are considered within the scope of the disclosed subject matter despite not being explicitly recited for the sake of clarity and brevity.

Figure 7:
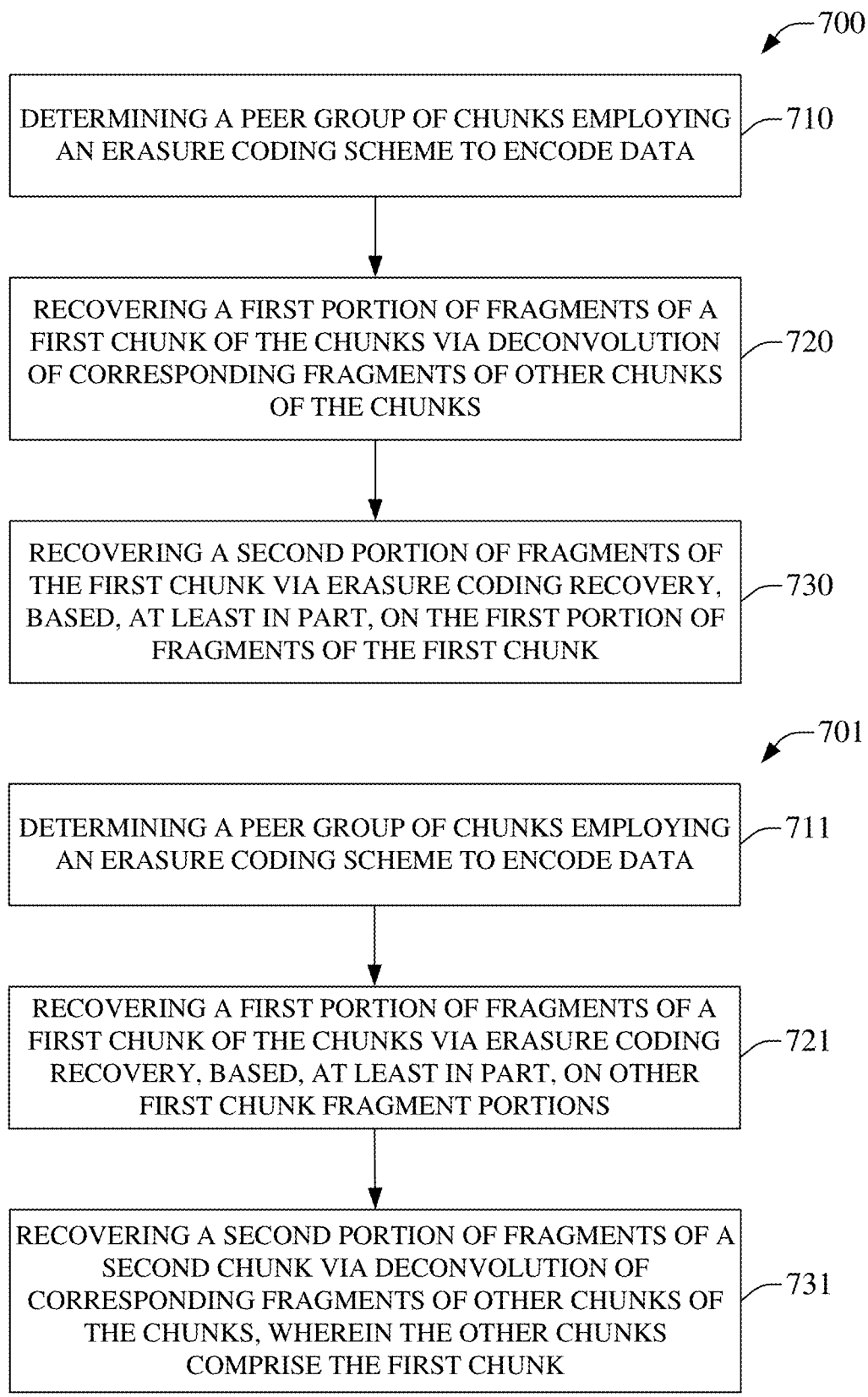
FIG. 7 is an illustration of example methods facilitating partial recovery of data via deconvolution then erasure decoding, via erasure decoding then deconvolution, etc. in accordance with aspects of the subject disclosure.
Figure 8:
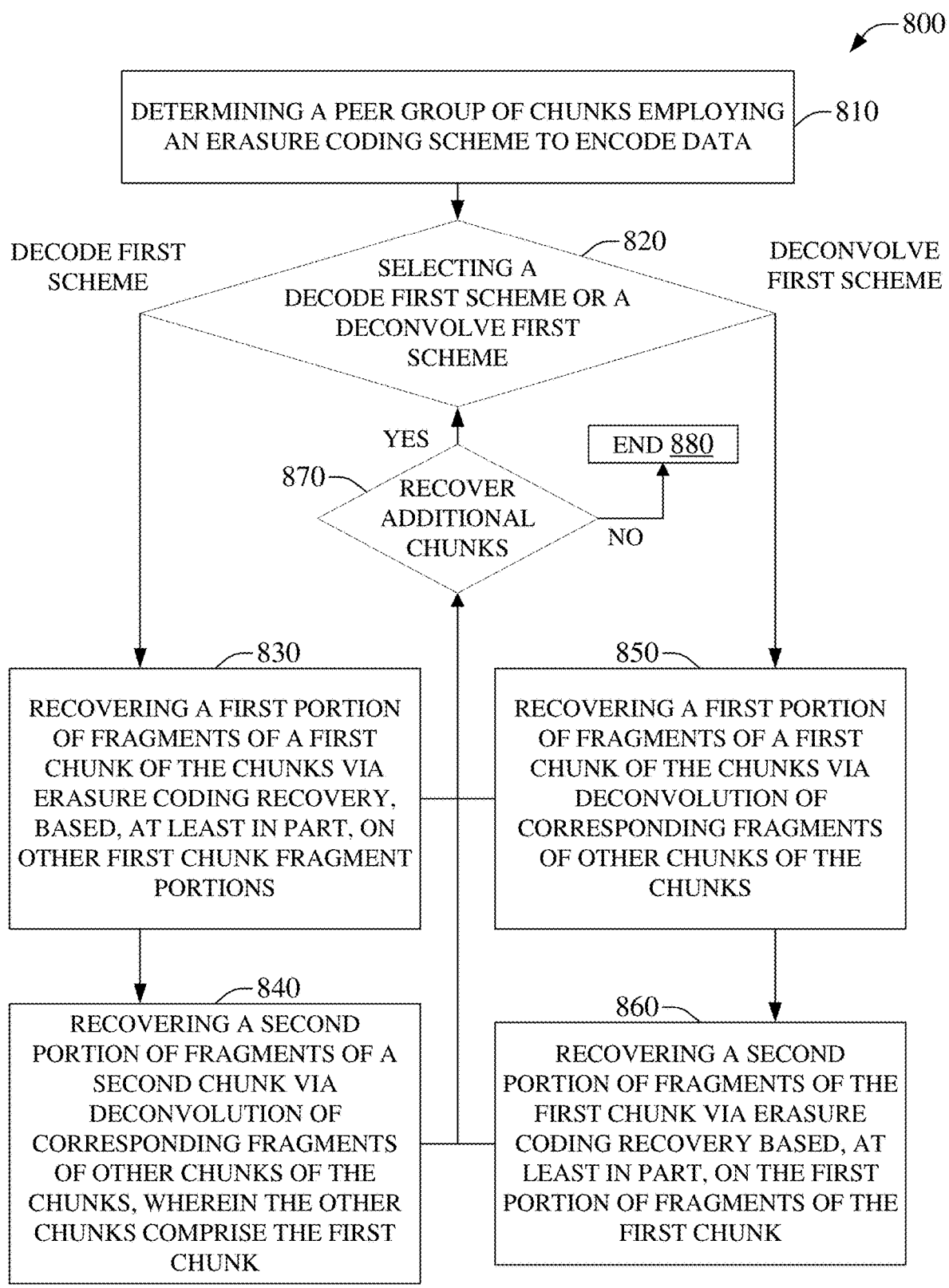
FIG. 8 illustrates an example method facilitating at least partial recovery of data via mixed deconvolution and erasure decoding, in accordance with aspects of the subject disclosure.

In view of the example system(s) described above, example method(s) that can be implemented in accordance with the disclosed subject matter can be better appreciated with reference to flowcharts in FIG. 7-FIG. 8. For purposes of simplicity of explanation, example methods disclosed herein are presented and described as a series of acts; however, it is to be understood and appreciated that the claimed subject matter is not limited by the order of acts, as some acts may occur in different orders and/or concurrently with other acts from that shown and described herein. For example, one or more example methods disclosed herein could alternatively be represented as a series of interrelated states or events, such as in a state diagram. Moreover, interaction diagram(s) may represent methods in accordance with the disclosed subject matter when disparate entities enact disparate portions of the methods. Furthermore, not all illustrated acts may be required to implement a described example method in accordance with the subject specification. Further yet, two or more of the disclosed example methods can be implemented in combination with each other, to accomplish one or more aspects herein described. It should be further appreciated that the example methods disclosed throughout the subject specification are capable of being stored on an article of manufacture (e.g., a computer-readable medium) to allow transporting and transferring such methods to computers for execution, and thus implementation, by a processor or for storage in a memory.

FIG. 7 is an illustration of an example method 700, which can facilitate partial recovery of data via deconvolution then erasure decoding, in accordance with aspects of the subject disclosure. At 710, method 700 can comprise determining a peer group of chunks employing an erasure coding scheme to encode data. A peer group of chunks can be a group of chunks related to a convolution operation. As an example, for chunks A, B, C, D, E, etc., where A XOR B=C, then a first peer group can comprise A, B, and C, but can exclude D and E. As another example, for chunks A, B, C, D, E, etc., where A XOR B=C, and where C XOR D=E, then a first peer group can comprise A, B, and C, but can exclude D and E and a second peer group can comprise C, D, and E but can exclude A and B, albeit information represented in A and B are indeed nested within the second peer group via C.

At 720, method 700 can comprise recovering a first portion of fragments of a first chunk of the chunks. In an aspect, the fragments can be generated according to the erasure coding scheme. Generally, all chunks of the peer group can employ the same erasure coding scheme and, accordingly, fragments can correlate to corresponding fragments among the chunks of the peer group. As an example, a first fragment of a first chunk can correspond to a first fragment of a second chunk, wherein the first and second chunk are part of the peer group, and wherein the first and second chunk employ the same erasure coding scheme. The recovering can be via deconvolution of corresponding fragments of other chunks of the chunks. As an example, where chunk A⊕chunk B=chunk C, then fragment Ai⊕fragment Bi=fragment Ci, where Ai indicates the i-th fragment of chunk A, Bi indicates the i-th fragment of chunk B, and Ci indicates the i-th fragment of chunk C. Accordingly, where fragment Ai⊕fragment Bi=fragment Ci, deconvolving fragment Ci with fragment Ai can result in fragment Bi, e.g., fragment Ci ⊕fragment Ai=fragment Bi, and deconvolving fragment Ci with fragment Bi can result in fragment Ai, e.g., fragment Ci⊕fragment Bi=fragment Ci.

Method 700, at 730, can comprise recovering a second portion of fragments of the first chunk via erasure coding recovery, based, at least in part, on the first portion of fragments of the first chunk. At this point method 700 can end. Erasure coding recovery can comprise decoding at least k fragments of a chunk encoded according to a k+m erasure coding scheme. Where at 720, the fragment deconvolution results in the first chunk comprising at least k fragments, other fragments can be recovered by decoding these at lease k fragments. As an example, where a first chunk encoded according to a 10+2 EC scheme comprises nine fragments and, for example, one additional fragment is recovered at 720 by fragment deconvolution, then the first chunk can now comprise ten fragments, whereby, ten fragments is sufficient to allow recovery of the other two missing, damaged, less accessible, etc., fragments of the first chunk via decoding according to the 10+2 erasure coding scheme.

In an aspect, method 701 can be the same as, or similar to, method 700, except that rather than performing a fragment deconvolution recovery at 720 and a erasure coding recovery at 730, method 701 can perform an erasure coding recovery at 721, then a fragment deconvolution recovery at 731. As such, at 711, method 701 can comprise determining a peer group of chunks employing an erasure coding scheme to encode data.

At 721, method 701 can comprise recovering a first portion of fragments of a first chunk of the chunks via erasure coding recovery based, at least in part, on other first chunk fragment portions. In an aspect, where the first chunk can be damaged but can retain at least k healthy fragments, these fragments can be employed to recover other fragments of the first chunk by decoding according to the erasure coding of the first chunk. As an example, where a first chunk encoded according to a 12+4 EC scheme comprises 13 fragments, then the first chunk can be sufficient to allow recovery of the other three missing, damaged, less accessible, etc., fragments of the first chunk via decoding according to the 12+4 erasure coding scheme.

At 731, method 701 can comprise recovering a second portion of fragments of a second chunk of the chunks. At this point method 701 can end. In an aspect, where all chunks of the peer group can employ the same erasure coding scheme and, accordingly, fragments can correlate to corresponding fragments among the chunks of the peer group, a fragment (s) of the first chunk and a fragment(s) of a third chunk of the peer group of chunks can be employed to fragment deconvolve a fragment(s) of the second chunk. As an example, the fragments of the first chunk can be recovered according to method 701 at 721, whereby an i-th fragment of the second chunk can be recovered by deconvolving an i-th fragment of the first chunk with an i-th fragment of the third chunk, e.g., fragment Ci⊕fragment Ai=fragment Bi.

In an aspect, use of method 700 and 701 in an iterative manner can enable recovery of damaged chunks. In an aspect, where all data fragments of a chunk of the peer group chunks have been recovered, remaining damaged, missing, less available, etc., coding fragments can be recovered using method 700 and/or method 701. In another aspect, where all data fragments of a chunk of the peer group chunks have been recovered, the chunk can also be re-encoded according to the erasure coding scheme to recover the corresponding coding fragments without further use of either method 700 or 701, e.g., the coding fragments can be regenerated rather than recovered.

FIG. 8 is an illustration of an example method 800, which can enable at least partial recovery of data via mixed deconvolution and erasure decoding, in accordance with aspects of the subject disclosure. At 810, method 800 can comprise determining a peer group of chunks employing an erasure coding scheme to encode data. This can be the same as, or similar to, the determining at 710 and/or 711 of method 700. As such, at 820, method 800 can comprise determining if a 'decode first' scheme or a 'deconvolve first' scheme will be employed. As an example, where a chunk(s) of the peer group comprises k or more fragments, the entire chunk can be recovered by employing a decode first scheme. This can result in more available fragments for a subsequent deconvolving iteration. As another example, where no chunk of the peer group comprises at least k fragments, then decoding can be ineffective to recover any other fragments and the deconvolve first scheme can be preferable at 820. Numerous other examples are readily appreciated and are considered within the scope of the instant disclosure even where not further recited for the sake of clarity and brevity.

Where the decode first scheme is indicated at 820, method 800, at 830, can comprise recovering a first portion of fragments of a first chunk of the chunks via erasure coding recovery. The erasure code recovery can be based, at least in part, on other first chunk fragment portions. In an aspect, where the first chunk can be damaged but can retain at least k healthy fragments, these fragments can be employed to recover other fragments of the first chunk by decoding according to the erasure coding of the first chunk. As an example, where a first chunk encoded according to a 10+2 EC scheme comprises 11 fragments, then the first chunk can be sufficient to allow recovery of the other one missing, damaged, less accessible, etc., fragment(s) of the first chunk via decoding according to the 10+2 erasure coding scheme.

At 840, method 800 can comprise recovering a second portion of fragments of a second chunk of the chunks. In an aspect, where all chunks of the peer group can employ the same erasure coding scheme and, accordingly, fragments can correlate to corresponding fragments among the chunks of the peer group, a fragment(s) of the first chunk and a fragment(s) of a third chunk of the peer group of chunks can be employed to fragment deconvolve a fragment(s) of the second chunk. As an example, the fragments of the first chunk can be recovered according to method 800 at 830, whereby an i-th fragment of the second chunk can be recovered by deconvolving an i-th fragment of the first chunk with an i-th fragment of the third chunk, e.g., fragment $C_i \oplus$ fragment $A_i$=fragment $B_i$. Method 800 can then go to decision block 870.

Returning to 820, method 800 can advance to 850 where a deconvolve first scheme is indicated. At 850, method 800 can comprise recovering a first portion of fragments of a first chunk of the chunks, via deconvolution of corresponding fragments of other chunks of the chunks. As an example, where chunk $A \oplus$ chunk $B$=chunk C, then fragment $A_i \oplus$ fragment $B_i$=fragment $C_i$, such that deconvolving fragment $C_i$ with fragment $A_i$ can result in fragment $B_i$, e.g., fragment $C_i \oplus$ fragment $A_i$=fragment $B_i$, and deconvolving fragment $C_i$ with fragment $B_i$ can result in fragment $A_i$, e.g., fragment $C_i \oplus$ fragment $B_i$=fragment $C_i$. In an aspect, a wide fragment, e.g., comprising data for more than one fragment, can be deconvolved as disclosed elsewhere herein.

Method 800 can then proceed to 860, which can comprise recovering a second portion of fragments of the first chunk via erasure coding recovery, based, at least in part, on the first portion of fragments of the first chunk. At this point method 800 can advance to decision block 870.

At 870, method 800 can determine if there are additional chunks to recover, e.g., if some chunks of the peer group remain damaged after an iteration from 820 to 870 of method 800, then an additional iteration can be performed. This can continue until there are no additional recoveries to perform, whereby method 800 can end at 880. In an aspect, no additional recoveries can be indicated where all chunks are recovered by method 800, all chunks are recovered by another method, recovery of the chunks is determined to be below a threshold value/priority/etc., the previous iteration of method 800 failed to recover further fragments, or some other cause of determining that further recovery is unwarranted.

In an aspect, system 500, illustrated in FIG. 5, can be an example of a recovery that can consume, in some embodiments, multiple iterations through a method, for example method 800. As an example, a first iteration of method 800 applied to system 500 can recover chunk 515, e.g., where method 840 can correspond to deconvolution recovery of fragments C1A to C4A at 502, and where method 850 can correspond to decoding recovery of fragments D1A, D3A, and D5A at 506. This can fully recover chunk 513 to 508 in a first iteration through method 800, however, chunks 523 and 533 can remain damaged, and missing fragments of those chunks can be recovered, for example, via subsequent iteration through method 800.

Figure 9:
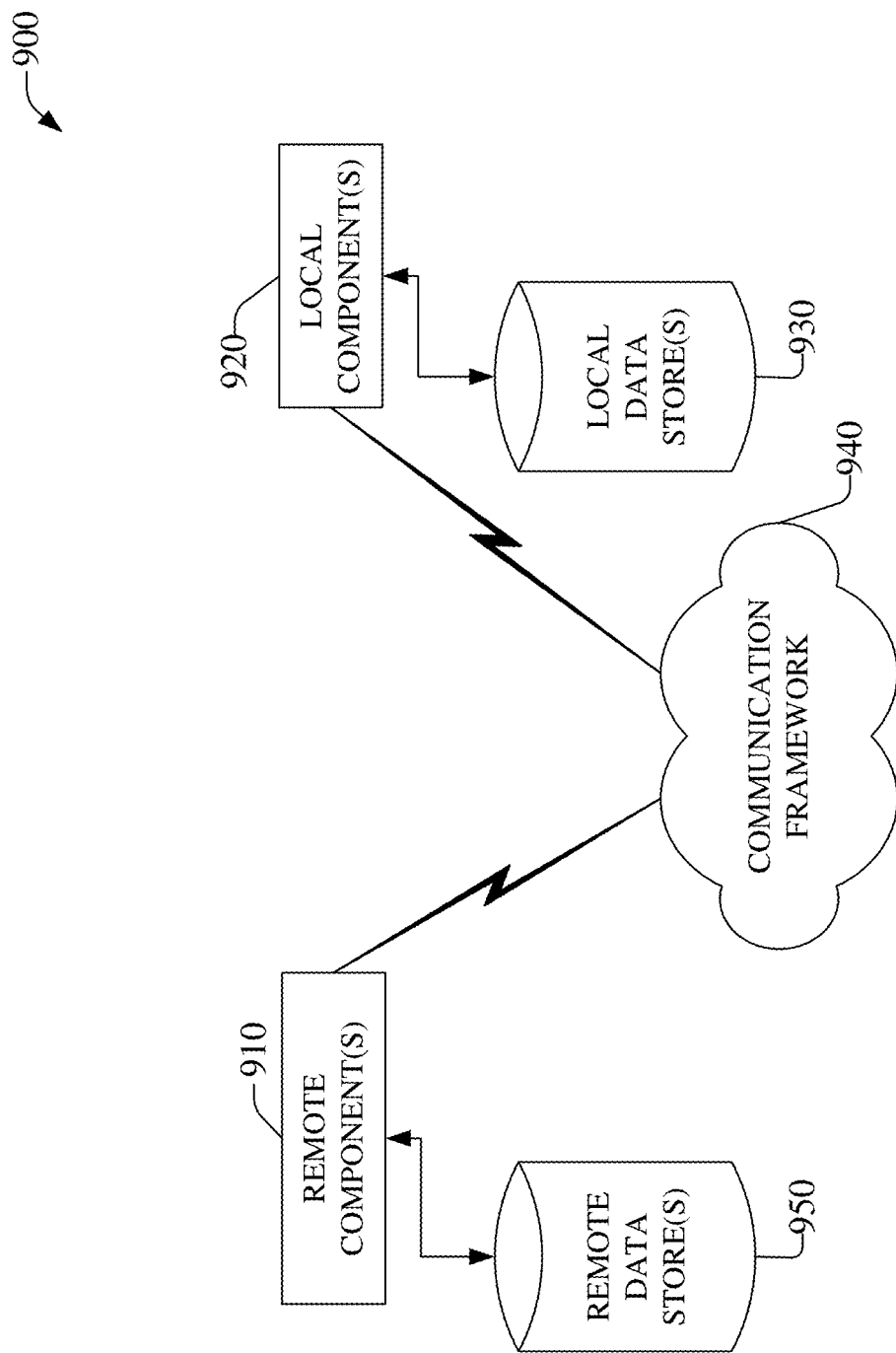
FIG. 9 depicts an example schematic block diagram of a computing environment with which the disclosed subject matter can interact.

FIG. 9 is a schematic block diagram of a computing environment 900 with which the disclosed subject matter can interact. The system 900 comprises one or more remote component(s) 910. The remote component(s) 910 can be hardware and/or software (e.g., threads, processes, computing devices). In some embodiments, remote component(s) 910 can be a remotely located ZSC connected to a local ZSC via communication framework 940. Communication framework 940 can comprise wired network devices, wireless network devices, mobile devices, wearable devices, radio access network devices, gateway devices, femtocell devices, servers, etc.

The system 900 also comprises one or more local component(s) 920. The local component(s) 920 can be hardware and/or software (e.g., threads, processes, computing devices). In some embodiments, local component(s) 920 can comprise a local ZSC connected to a remote ZSC via communication framework 940. In an aspect the remotely located ZSC or local ZSC can be embodied in one or more of ZSC 110-130, 210-230, etc.

One possible communication between a remote component(s) 910 and a local component(s) 920 can be in the form of a data packet adapted to be transmitted between two or more computer processes. Another possible communication between a remote component(s) 910 and a local component(s) 920 can be in the form of circuit-switched data adapted to be transmitted between two or more computer processes in radio time slots. The system 900 comprises a communication framework 940 that can be employed to facilitate communications between the remote component(s) 910 and the local component(s) 920, and can comprise an air interface, e.g., Uu interface of a UMTS network, via a long-term evolution (LTE) network, etc. Remote component(s) 910 can be operably connected to one or more remote data store(s) 950, such as a hard drive, solid state drive, SIM card, device memory, etc., that can be employed to store information on the remote component(s) 910 side of communication framework 940. Similarly, local component(s) 920 can be operably connected to one or more local data store(s) 930, that can be employed to store information on the local component(s) 920 side of communication framework 940. As examples, information corresponding to chunks stored on ZSCs can be communicated via communication framework 940 to other ZSCs of a storage network, e.g., to facilitate compression and storage in partial or complete chunks on a ZSC as disclosed herein.

Figure 10:
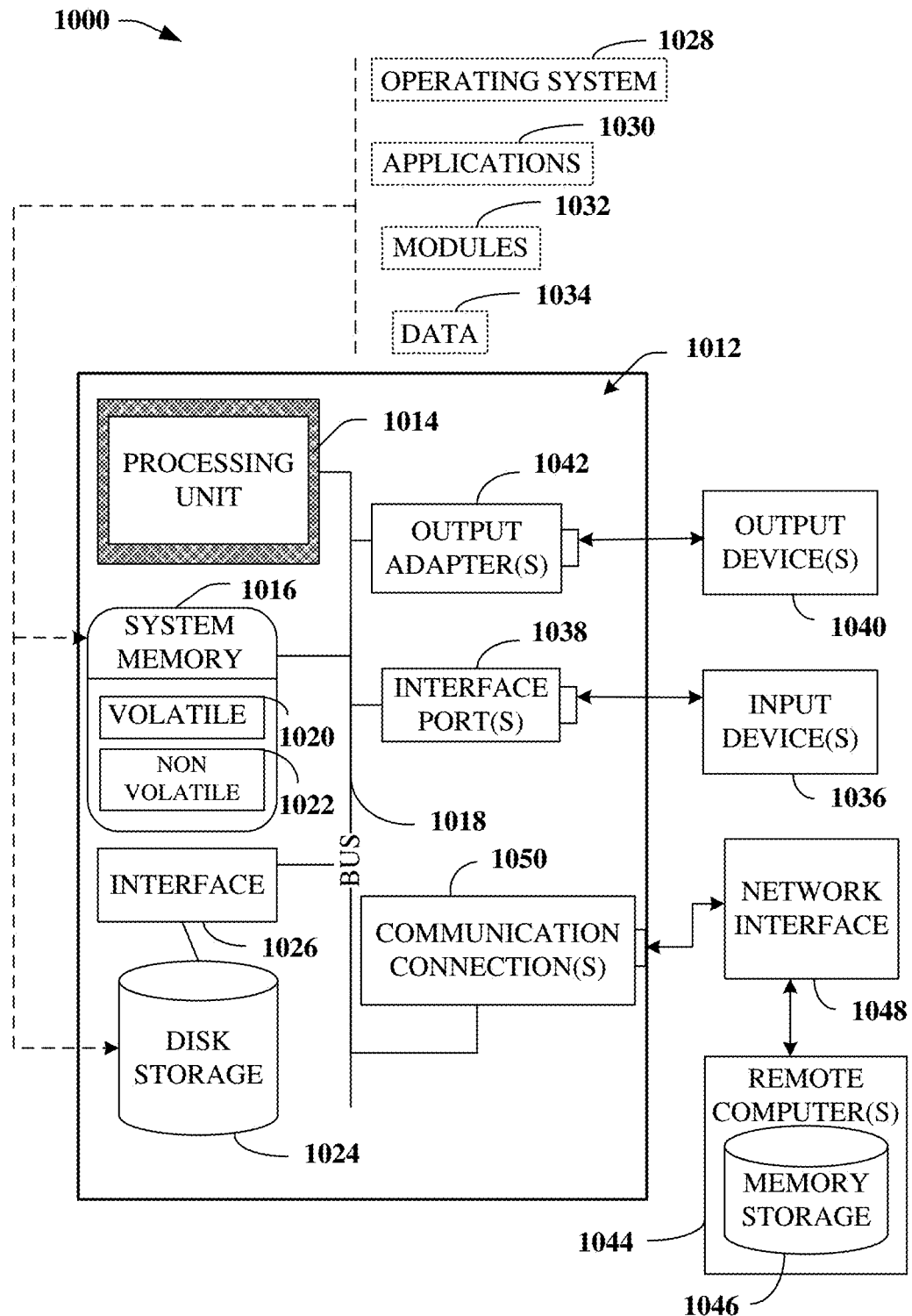
FIG. 10 illustrates an example block diagram of a computing system operable to execute the disclosed systems and methods in accordance with an embodiment.

In order to provide a context for the various aspects of the disclosed subject matter, FIG. 10, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that the disclosed subject matter also can be implemented in combination with other program modules. Generally, program modules comprise routines, programs, components, data structures, etc. that performs particular tasks and/or implement particular abstract data types.

In the subject specification, terms such as "store," "storage," "data store," data storage," "database," and substantially any other information storage component relevant to operation and functionality of a component, refer to "memory components," or entities embodied in a "memory"

or components comprising the memory. It is noted that the memory components described herein can be either volatile memory or nonvolatile memory, or can comprise both volatile and nonvolatile memory, by way of illustration, and not limitation, volatile memory 1020 (see below), nonvolatile memory 1022 (see below), disk storage 1024 (see below), and memory storage 1046 (see below). Further, nonvolatile memory can be included in read only memory, programmable read only memory, electrically programmable read only memory, electrically erasable read only memory, or flash memory. Volatile memory can comprise random access memory, which acts as external cache memory. By way of illustration and not limitation, random access memory is available in many forms such as synchronous random access memory, dynamic random access memory, synchronous dynamic random access memory, double data rate synchronous dynamic random access memory, enhanced synchronous dynamic random access memory, SynchLink dynamic random access memory, and direct Rambus random access memory. Additionally, the disclosed memory components of systems or methods herein are intended to comprise, without being limited to comprising, these and any other suitable types of memory.

Moreover, it is noted that the disclosed subject matter can be practiced with other computer system configurations, comprising single-processor or multiprocessor computer systems, mini-computing devices, mainframe computers, as well as personal computers, hand-held computing devices (e.g., personal digital assistant, phone, watch, tablet computers, netbook computers, . . . ), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

FIG. 10 illustrates a block diagram of a computing system 1000 operable to execute the disclosed systems and methods in accordance with an embodiment. Computer 1012, which can be, for example, comprised in a ZSC, e.g., ZSC 110-130, 210-230, etc., can comprise a processing unit 1014, a system memory 1016, and a system bus 1018. System bus 1018 couples system components comprising, but not limited to, system memory 1016 to processing unit 1014. Processing unit 1014 can be any of various available processors. Dual microprocessors and other multiprocessor architectures also can be employed as processing unit 1014.

System bus 1018 can be any of several types of bus structure(s) comprising a memory bus or a memory controller, a peripheral bus or an external bus, and/or a local bus using any variety of available bus architectures comprising, but not limited to, industrial standard architecture, microchannel architecture, extended industrial standard architecture, intelligent drive electronics, video electronics standards association local bus, peripheral component interconnect, card bus, universal serial bus, advanced graphics port, personal computer memory card international association bus, Firewire (Institute of Electrical and Electronics Engineers 1194), and small computer systems interface.

System memory 1016 can comprise volatile memory 1020 and nonvolatile memory 1022. A basic input/output system, containing routines to transfer information between elements within computer 1012, such as during start-up, can be stored in nonvolatile memory 1022. By way of illustration, and not limitation, nonvolatile memory 1022 can comprise read only memory, programmable read only memory, electrically programmable read only memory, electrically erasable read only memory, or flash memory. Volatile memory 1020 comprises read only memory, which acts as external cache memory. By way of illustration and not limitation, read only memory is available in many forms such as synchronous random access memory, dynamic read only memory, synchronous dynamic read only memory, double data rate synchronous dynamic read only memory, enhanced synchronous dynamic read only memory, SynchLink dynamic read only memory, Rambus direct read only memory, direct Rambus dynamic read only memory, and Rambus dynamic read only memory.

Computer 1012 can also comprise removable/non-removable, volatile/non-volatile computer storage media. FIG. 10 illustrates, for example, disk storage 1024. Disk storage 1024 comprises, but is not limited to, devices like a magnetic disk drive, floppy disk drive, tape drive, flash memory card, or memory stick. In addition, disk storage 1024 can comprise storage media separately or in combination with other storage media comprising, but not limited to, an optical disk drive such as a compact disk read only memory device, compact disk recordable drive, compact disk rewritable drive or a digital versatile disk read only memory. To facilitate connection of the disk storage devices 1024 to system bus 1018, a removable or non-removable interface is typically used, such as interface 1026.

Computing devices typically comprise a variety of media, which can comprise computer-readable storage media or communications media, which two terms are used herein differently from one another as follows.

Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can comprise, but are not limited to, read only memory, programmable read only memory, electrically programmable read only memory, electrically erasable read only memory, flash memory or other memory technology, compact disk read only memory, digital versatile disk or other optical disk storage, magnetic cassettes, magnetic tape, magnetic disk storage or other magnetic storage devices, or other tangible media which can be used to store desired information. In this regard, the term "tangible" herein as may be applied to storage, memory or computer-readable media, is to be understood to exclude only propagating intangible signals per se as a modifier and does not relinquish coverage of all standard storage, memory or computer-readable media that are not only propagating intangible signals per se. In an aspect, tangible media can comprise non-transitory media wherein the term "non-transitory" herein as may be applied to storage, memory or computer-readable media, is to be understood to exclude only propagating transitory signals per se as a modifier and does not relinquish coverage of all standard storage, memory or computer-readable media that are not only propagating transitory signals per se. Computer-readable storage media can be accessed by one or more local or remote computing devices, e.g., via access requests, queries or other data retrieval protocols, for a variety of operations with respect to the information stored by the medium. As such, for example, a computer-readable medium can comprise executable instructions stored thereon that, in response to execution, can cause a system comprising a processor to perform operations, comprising determining a first recovery scheme and a second recovery scheme for recovering data, ranking the determined recovery schemes according to how they are expected to perform, and employing a recovery scheme based on the determined performance. This can comprise selecting a 'deconvolve first' scheme or a 'decode first' scheme, for example, to achieve better performance relative to criteria, such as, how many iterations are predicted, how many computing resources are expected to be consumed, how long it will take, and what the value of the data is should it not be recovered, among others, as is disclosed herein.

Communications media typically embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communication media comprise wired media, such as a wired network or direct-wired connection, and wireless media such as acoustic, RF, infrared and other wireless media.

It can be noted that FIG. 10 describes software that acts as an intermediary between users and computer resources described in suitable operating environment 1000. Such software comprises an operating system 1028. Operating system 1028, which can be stored on disk storage 1024, acts to control and allocate resources of computer system 1012. System applications 1030 take advantage of the management of resources by operating system 1028 through program modules 1032 and program data 1034 stored either in system memory 1016 or on disk storage 1024. It is to be noted that the disclosed subject matter can be implemented with various operating systems or combinations of operating systems.

A user can enter commands or information into computer 1012 through input device(s) 1036. In some embodiments, a user interface can allow entry of user preference information, etc., and can be embodied in a touch sensitive display panel, a mouse/pointer input to a graphical user interface (GUI), a command line controlled interface, etc., allowing a user to interact with computer 1012. Input devices 1036 comprise, but are not limited to, a pointing device such as a mouse, trackball, stylus, touch pad, keyboard, microphone, joystick, game pad, satellite dish, scanner, TV tuner card, digital camera, digital video camera, web camera, cell phone, smartphone, tablet computer, etc. These and other input devices connect to processing unit 1014 through system bus 1018 by way of interface port(s) 1038. Interface port(s) 1038 comprise, for example, a serial port, a parallel port, a game port, a universal serial bus, an infrared port, a Bluetooth port, an IP port, or a logical port associated with a wireless service, etc. Output device(s) 1040 use some of the same type of ports as input device(s) 1036.

Thus, for example, a universal serial bus port can be used to provide input to computer 1012 and to output information from computer 1012 to an output device 1040. Output adapter 1042 is provided to illustrate that there are some output devices 1040 like monitors, speakers, and printers, among other output devices 1040, which use special adapters. Output adapters 1042 comprise, by way of illustration and not limitation, video and sound cards that provide means of connection between output device 1040 and system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. Remote computer(s) 1044 can be a personal computer, a server, a router, a network PC, cloud storage, a cloud service, code executing in a cloud-computing environment, a workstation, a microprocessor-based appliance, a peer device, or other common network node and the like, and typically comprises many or all of the elements described relative to computer 1012. A cloud computing environment, the cloud, or other similar terms can refer to computing that can share processing resources and data to one or more computer and/or other device(s) on an as needed basis to enable access to a shared pool of configurable computing resources that can be provisioned and released readily. Cloud computing and storage solutions can store and/or process data in third-party data centers which can leverage an economy of scale and can view accessing computing resources via a cloud service in a manner similar to a subscribing to an electric utility to access electrical energy, a telephone utility to access telephonic services, etc.

For purposes of brevity, only a memory storage device 1046 is illustrated with remote computer(s) 1044. Remote computer(s) 1044 is logically connected to computer 1012 through a network interface 1048 and then physically connected by way of communication connection 1050. Network interface 1048 encompasses wire and/or wireless communication networks such as local area networks and wide area networks. Local area network technologies comprise fiber distributed data interface, copper distributed data interface, Ethernet, Token Ring and the like. Wide area network technologies comprise, but are not limited to, point-to-point links, circuit-switching networks like integrated services digital networks and variations thereon, packet switching networks, and digital subscriber lines. As noted below, wireless technologies may be used in addition to or in place of the foregoing.

Communication connection(s) 1050 refer(s) to hardware/software employed to connect network interface 1048 to bus 1018. While communication connection 1050 is shown for illustrative clarity inside computer 1012, it can also be external to computer 1012. The hardware/software for connection to network interface 1048 can comprise, for example, internal and external technologies such as modems, comprising regular telephone grade modems, cable modems and digital subscriber line modems, integrated services digital network adapters, and Ethernet cards.

The above description of illustrated embodiments of the subject disclosure, comprising what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units.

As used in this application, the terms "component," "system," "platform," "layer," "selector," "interface," and the like are intended to refer to a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. Moreover, the use of any particular embodiment or example in the present disclosure should not be treated as exclusive of any other particular embodiment or example, unless expressly indicated as such, e.g., a first embodiment that has aspect A and a second embodiment that has aspect B does not preclude a third embodiment that has aspect A and aspect B. The use of granular examples and embodiments is intended to simplify understanding of certain features, aspects, etc., of the disclosed subject matter and is not intended to limit the disclosure to said granular instances of the disclosed subject matter or to illustrate that combinations of embodiments of the disclosed subject matter were not contemplated at the time of actual or constructive reduction to practice.

Further, the term "include" is intended to be employed as an open or inclusive term, rather than a closed or exclusive term. The term "include" can be substituted with the term "comprising" and is to be treated with similar scope, unless otherwise explicitly used otherwise. As an example, "a basket of fruit including an apple" is to be treated with the same breadth of scope as, "a basket of fruit comprising an apple."

Furthermore, the terms "user," "subscriber," "customer," "consumer," "prosumer," "agent," and the like are employed interchangeably throughout the subject specification, unless context warrants particular distinction(s) among the terms. It should be appreciated that such terms can refer to human entities, machine learning components, or automated components (e.g., supported through artificial intelligence, as through a capacity to make inferences based on complex mathematical formalisms), that can provide simulated vision, sound recognition and so forth.

Aspects, features, or advantages of the subject matter can be exploited in substantially any, or any, wired, broadcast, wireless telecommunication, radio technology or network, or combinations thereof. Non-limiting examples of such technologies or networks comprise broadcast technologies (e.g., sub-Hertz, extremely low frequency, very low frequency, low frequency, medium frequency, high frequency, very high frequency, ultra-high frequency, super-high frequency, extremely high frequency, terahertz broadcasts, etc.); Ethernet; X.25; powerline-type networking, e.g., Powerline audio video Ethernet, etc.; femtocell technology; Wi-Fi; worldwide interoperability for microwave access; enhanced general packet radio service; second generation partnership project (2G or 2GPP); third generation partnership project (3G or 3GPP); fourth generation partnership project (4G or 4GPP); long term evolution (LTE); fifth generation partnership project (5G or 5GPP); third generation partnership project universal mobile telecommunications system; third generation partnership project 2; ultra mobile broadband; high speed packet access; high speed downlink packet access; high speed uplink packet access; enhanced data rates for global system for mobile communication evolution radio access network; universal mobile telecommunications system terrestrial radio access network; or long term evolution advanced. As an example, a millimeter wave broadcast technology can employ electromagnetic waves in the frequency spectrum from about 30 GHz to about 300 GHz. These millimeter waves can be generally situated between microwaves (from about 1 GHz to about 30 GHz) and infrared (IR) waves, and are sometimes referred to extremely high frequency (EHF). The wavelength ($\lambda$) for millimeter waves is typically in the 1-mm to 10-mm range.

The term "infer" or "inference" can generally refer to the process of reasoning about, or inferring states of, the system, environment, user, and/or intent from a set of observations as captured via events and/or data. Captured data and events can include user data, device data, environment data, data from sensors, sensor data, application data, implicit data, explicit data, etc. Inference, for example, can be employed to identify a specific context or action, or can generate a probability distribution over states of interest based on a consideration of data and events. Inference can also refer to techniques employed for composing higher-level events from a set of events and/or data. Such inference results in the construction of new events or actions from a set of observed events and/or stored event data, whether the events, in some instances, can be correlated in close temporal proximity, and whether the events and data come from one or several event and data sources. Various classification schemes and/or systems (e.g., support vector machines, neural networks, expert systems, Bayesian belief networks, fuzzy logic, and data fusion engines) can be employed in connection with performing automatic and/or inferred action in connection with the disclosed subject matter.

What has been described above includes examples of systems and methods illustrative of the disclosed subject matter. It is, of course, not possible to describe every combination of components or methods herein. One of ordinary skill in the art may recognize that many further combinations and permutations of the claimed subject matter are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

What is claimed is:

1. A system, comprising:
a processor; and
a memory that stores executable instructions that, when executed by the processor, facilitate performance of operations, comprising:
determining a peer group of chunks stored via a geographically distributed data storage system, wherein the chunks of the peer group of chunks employ a same erasure coding scheme;
selecting a recovery scheme from a group of recovery schemes comprising a 'deconvolve first' scheme and a 'decode first' scheme, wherein the selecting is based on a criterion selected from a group of criteria comprising a count criterion based on a predicted count of operations to complete a corresponding recovery, a time criterion based on a predicted time to complete the corresponding recovery, a consumption criterion based on a predicted consumption of system resources to complete the corresponding recovery, and a monetary value criterion corresponding to data to recovered in the corresponding recovery;
in response to selecting the 'deconvolve first' scheme, recovering a first fragment of a first chunk of the peer group of chunks based in part on a second fragment of a second chunk of the peer group of chunks, and
recovering a third fragment of the first chunk based in part on a fourth fragment of the first chunk; and
in response to selecting the 'decode first' scheme,
recovering a fifth fragment of the first chunk of the peer group of chunks based in part on a sixth fragment of the first chunk, and
recovering a seventh fragment of the second chunk based in part on an eighth fragment of the first chunk.

2. The system of claim 1, wherein the chunks of the peer group of chunks employ a 12+4 erasure coding scheme.

3. The system of claim 1, wherein the chunks of the peer group of chunks employ a 10+2 erasure coding scheme.

4. The system of claim 1, wherein the chunks of the peer group of chunks comprise at least a third chunk, and wherein the second chunk results from comprising the first chunk and the at least the third chunk.

5. The system of claim 4, wherein the third chunk results from convolving a fourth chunk and at least a fifth chunk.

6. The system of claim 5, wherein the fourth chunk employs the same erasure coding scheme as the first chunk employs.

7. The system of claim 5, wherein the fourth chunk employs a different erasure coding scheme than the first chunk employs.

8. The system of claim 5, wherein the at least the fifth chunk employs the same erasure coding scheme as the first chunk employs.

9. The system of claim 5, wherein the at least the fifth chunk employs a different erasure coding scheme as the first chunk employs.

10. The system of claim 4, wherein the convolving the first chunk and the at least the third chunk comprises a chunk-level exclusive-or operation that occurs before employing the same erasure coding scheme.

11. The system of claim 4, wherein the convolving the first chunk and the at least the third chunk comprises a fragment-level exclusive-or operation that occurs after employing the same erasure coding scheme.

12. A method, comprising:
in response to determining, by a system comprising a processor, that a portion of a peer group of chunks stored in a geographically diverse data storage system has become less available than a previous state of availability, determining a type of a first iteration of a recovery process, wherein all chunks comprising the peer group of chunks employ a same erasure coding process, wherein the determining the type of the first iteration of the recovery process is based on a predicted criterion selected from a group of criteria comprising a count criterion based on a predicted count of operations to complete a corresponding recovery comprising the first iteration of the recovery process, a time criterion based on a predicted time to complete the corresponding recovery, a consumption criterion based on a predicted consumption of system resources to complete the corresponding recovery, and a predicted monetary value criterion corresponding to the less available data;
in response to the type of the first iteration being a 'deconvolve first' type,
recovering, by the system, a first fragment of a first chunk of the peer group of chunks based in part on a second fragment of a second chunk of the peer group of chunks, and
recovering a third fragment of the first chunk based in part on a fourth fragment of the first chunk; and
in response to the type of the first iteration being a 'decode first' type, recovering, by the system, a fifth fragment of the first chunk based in part on a sixth fragment of the first chunk, and recovering a seventh fragment of the second chunk based in part on an eighth fragment of the first chunk.

13. The method of claim 12, wherein the determining the type of the first iteration of the recovery process comprises determining that the first chunk comprises more than m less-available fragments.

14. The method of claim 13, wherein the erasure coding process comprises k+m fragments, and wherein the erasure coding process is selected from a group of erasure coding schema comprising a 12+4 erasure coding process and a 10+2 erasure coding process.

15. The method of claim 12, wherein the determining the type of the first iteration of the recovery process comprises determining that the first fragment of the first chunk is a corresponding fragment with the second fragment of the second chunk and is a corresponding fragment with a ninth fragment of a third chunk of the peer group of chunks, wherein the first fragment is a less-available fragment, wherein the second fragment is an available fragment, and wherein the ninth fragment is an available fragment.

16. The method of claim 12, wherein the operations further comprise:
in response to determining, by the system, that the portion of the peer group of chunks remains less available than the previous state of availability, determining another type of a second iteration of the recovery process;
in response to the second iteration type being a 'deconvolve first' type,
recovering, by the system, ninth fragment of a third chunk of the peer group of chunks based in part on a tenth fragment of a fourth chunk of the peer group of chunks, and
recovering a eleventh fragment of the third chunk based in part on a twelfth fragment of the third chunk; and
in response to the second iteration type being a 'decode first' type,
recovering, by the system, a thirteenth fragment of the third chunk based in part on a fourteenth fragment of the third chunk, and
recovering a fifteenth fragment of the fourth chunk based in part on an sixteenth fragment of the third chunk.

17. A non-transitory machine-readable storage medium, comprising executable instructions that, when executed by a processor, facilitate performance of operations, comprising:
for a peer group of chunks stored via a geographically distributed data storage system, wherein the peer group of chunks comprises a first chunk, a second chunk, and a third chunk, wherein all chunks comprising the peer group of chunks employ a same erasure coding scheme, determining a first recovery scheme for recovering data, wherein the first recovery scheme comprises:
initially recovering a first fragment of a first chunk of the peer group of chunks based in part on a second fragment of a second chunk of the peer group of chunks, and
subsequently recovering a third fragment of the first chunk based in part on a fourth fragment of the first chunk;
determining a second recovery scheme for recovering the data, wherein the second recovery scheme comprises:
initially recovering a fifth fragment of the first chunk of the peer group of chunks based in part on a sixth fragment of the first chunk, and
subsequently recovering a seventh fragment of the second chunk based in part on an eighth fragment of the first chunk;
ranking recovery schema according to a determined performance, wherein the determined performance is based on a criterion selected from a group of criteria comprising a count criterion based on a predicted count of operations to complete a corresponding recovery scheme, and wherein the recovery schema comprise the first recovery scheme and the second recovery scheme; and
employing a selected recovery scheme to recover a portion of the peer group of chunks, wherein the selected recovery scheme is selected based on the ranking of the selected recovery scheme among the ranked recovery schema.

18. The non-transitory machine-readable storage medium of claim 17, wherein the same erasure coding scheme is selected from erasure coding schema comprising a 12+4 erasure coding scheme and a 10+2 erasure coding scheme.

19. The non-transitory machine-readable storage medium of claim 17, wherein the group of criteria further comprises a time criterion based on a predicted time to complete the corresponding recovery scheme, a consumption criterion based on a predicted consumption of system resources to complete the corresponding recovery scheme, and a monetary criterion based on a monetary value of the data criteria.

20. The non-transitory machine-readable storage medium of claim 17, wherein the second chunk is a convolution of the first chunk and the third chunk.

* * * * *